(12) United States Patent
Hsieh

(10) Patent No.: US 8,614,482 B2
(45) Date of Patent: Dec. 24, 2013

(54) SEMICONDUCTOR POWER DEVICE HAVING IMPROVED TERMINATION STRUCTURE FOR MASK SAVING

(75) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 33 days.

(21) Appl. No.: 13/341,399

(22) Filed: Dec. 30, 2011

(65) Prior Publication Data

US 2013/0168761 A1 Jul. 4, 2013

(51) Int. Cl.
*H01L 29/66* (2006.01)
*H01L 21/336* (2006.01)

(52) U.S. Cl.
USPC ............... 257/330; 257/E29.02; 257/E27.01; 438/270

(58) Field of Classification Search
CPC ............ H01L 29/7813; H01L 29/4236; H01L 29/66734
USPC ......... 257/329, 330, E29.13, E29.02, E27.01; 438/270, 424, 425
See application file for complete search history.

(56) References Cited

U.S. PATENT DOCUMENTS

| | | | |
|---|---|---|---|
| 6,388,286 B1 * | 5/2002 | Baliga ........................ | 257/330 |
| 6,855,986 B2 * | 2/2005 | Hsieh et al. ................. | 257/339 |
| 2003/0047777 A1 * | 3/2003 | In't Zandt et al. .......... | 257/329 |
| 2003/0127702 A1 * | 7/2003 | Blair et al. .................. | 257/510 |
| 2005/0062124 A1 * | 3/2005 | Chiola ........................ | 257/476 |
| 2005/0112823 A1 * | 5/2005 | Cao et al. .................... | 438/270 |
| 2007/0042552 A1 * | 2/2007 | Ma ............................. | 438/270 |
| 2011/0227151 A1 * | 9/2011 | Hsu et al. .................... | 257/334 |

* cited by examiner

*Primary Examiner* — Nikolay Yushin
(74) *Attorney, Agent, or Firm* — Bacon & Thomas, PLLC

(57) ABSTRACT

A improved termination structure for semiconductor power devices is disclosed, comprising a trenched field plate formed not only along trench sidewall but also on trench bottom of the wide termination trench by doing poly-silicon CMP so that body ion implantation is blocked by the trenched field plate on the trench bottom to prevent a body region formation underneath the trench bottom of the wide termination trench, degrading avalanche voltage.

20 Claims, 21 Drawing Sheets

SEMICONDUCTOR POWER DEVICE HAVING IMPROVED TERMINATION STRUCTURE FOR MASK SAVING

FIELD OF THE INVENTION

This invention relates generally to the cell structure, device configuration and fabrication process of semiconductor power devices. More particularly, this invention relates to an improved cell configuration and improved fabrication process to manufacture semiconductor power devices having improved termination structure for mask saving.

BACKGROUND OF THE INVENTION

Semiconductor power devices having trenched gate structure, including trench MOSFET (metal oxide semiconductor field effect transistor), trench IGBT (insulated gate bipolar transistor) or trench Schottky rectifier, are usually used in switching-mode power supplies and in other high switching speed applications. Apart from the device configuration in an active area, a design of a termination area structure of the semiconductor power devices plays an increasingly vital role to maintain breakdown voltage of the semiconductor power devices. Meanwhile, there is still a need to reduce the manufacturing cost and to simply the manufacturing process to meet the requirement for mass production. Therefore, in view of so, U.S. Pat. Nos. 6,309,929, 6,396,090, 6,855,986 and 7,612,407 disclose several device configuration and manufacturing method to make semiconductor power devices with a termination area having trenched field plate which is formed into a space-like gate structure by doing dry poly-silicon etch.

FIG. 1A is a cross-sectional view of an N-channel trench MOSFET with a termination area 100 disclosed in the prior art of U.S. Pat. No. 6,396,090, which is formed in an N− epitaxial layer 101 extending onto a semiconductor N+ substrate 102 which is coated with a drain metal on a rear side. The termination area 100 further comprises: a wide termination trench 103 formed in the N− epitaxial layer 101; a spacer-like gate structure 104 padded by a gate oxide layer 105 and formed only along a trench sidewall of the wide termination trench 103; an inter-conductive oxide layer 106 covering surface of the spacer-like gate structure 104; a termination oxide layer 107 formed in the wide termination trench 103 to define a contact area for a source metal to contact with an active area. On the other hand, according to the prior art, a body mask is saved because that the silicon layer for the P body region 108 is epitaxially formed without requiring a body mask.

FIG. 1B is a cross-sectional view of a trench Schottky rectifier disclosed in U.S. Pat. No. 6,309,929 with a termination area 110 which is formed by a similar method to that of FIG. 1A, wherein the termination area structure 110 also comprises a spacer-like gate structure 114 padded by a gate oxide layer 115 and located only along a trench sidewall of a wide termination trench 116. As for the trench Schottky rectifier, there is no an inter-conductive oxide layer (as the inter-conductive oxide layer 106 in FIG. 1A) covering the surface of the spacer-like gate structure 114 as to provide a contact between an anode metal and the spacer-like gate structure 114.

FIG. 1C is a cross-sectional view of another trench Schottky rectifier with a termination area 120 disclosed in U.S. Pat. No. 6,855,593. Comparing with the termination area 110 in FIG. 1B, the termination area 120 comprises a gate oxide layer 121 along whole trench bottom and trench sidewall of a wide termination trench 122 which is not extended to a device edge (illustrated by a scribe line), onto the gate oxide layer 121, a spacer-like gate structure 123 is formed along the trench sidewall on both sides of the wide termination trench 122 in view of the cross-sectional drawing, and exposing a part of the trench bottom of the wide termination trench 122.

The termination area structure comprising the wide termination trench and the spacer-like gate structure aforementioned do have the capability of preventing voltage breakdown phenomena from premature without requiring an extra cost which is superior to other conventional termination area structures known to those having skill in the art. However, when making a trench MOSFET with a termination area using the aforementioned configuration and method, for example in FIG. 1A, a pronounced problem comes out that the P type semiconductor layer for the P body region 108 is formed epitaxially before etching a plurality of trenches 109 in the active area to save a body mask as discussed above, causing Boron segregation along trench sidewalls of the trenches 109 in the active area during a growth step for a sacrificial oxide (not shown) and for the gate oxide layer 105 and leading to undesirable punch-through vulnerabilities. The punch-through issue becomes more pronounced when cell pitch of the semiconductor power device is decreased less than 2.0 um.

In order to overcome the punch-through issue, another semiconductor power device with a termination area structure 130 is disclosed in U.S. Pat. No. 7,612,407 wherein the body region is formed by an ion implantation step after forming a plurality of trenches, as shown in FIG. 1D. The termination area structure 130 comprises an oxide layer 131 formed in middle of a spacer-like gate structure 132 in a wide termination trench 133 before the ion implantation process for formation of the P body region 134. Therefore, the P body region 134 will not be disposed below trench bottom of the wide termination trench 133 because the oxide layer 131 is acting as a body ion implantation blocking layer, sustaining a high breakdown voltage in the termination area structure 130. However, there is an extra cost for depositing and CMP (Chemical Mechanical Polishing) the oxide layer 131, which is not conductive to mass production.

Therefore, there is still a need in the art of the semiconductor power device design and fabrication, particular in the termination area, to provide a novel cell structure, device configuration and fabrication process that would further resolve the problems discussed above.

SUMMARY OF THE INVENTION

It is therefore an aspect of the present invention to provide a semiconductor power device with an improved termination area structure so that the two goals of sustaining a high breakdown voltage and reducing the manufacturing cost can be satisfied simultaneously. The trench semiconductor power device can be trench MOSFET, trench IGBT or trench Schottky rectifier, or integrated circuit selected therefrom. According to the present invention, there is provided a semiconductor power device with an improved termination area structure and having a plurality of trenched gates in an active area, the termination area structure comprising: a semiconductor layer comprising an epitaxial layer of a first conductivity type extending over a substrate, the semiconductor layer further comprising the semiconductor power device; a wide termination trench extending from a boundary of the active area; a termination insulating layer formed along trench bottom and trench sidewall of the wide termination trench; a trenched field plate having a L shape or U shape structure formed onto the termination insulating layer and covering along the trench bottom and the trench sidewall of the wide termination trench; the trenched field plate being a doped poly-silicon layer; an inter-insulating layer covering outer surface of the trenched field plate and extending to cover atop the active area; a bottom electrode on a bottom side of the semiconductor layer; a top electrode atop the inter-insulating layer and connected to the trenched field plate through a trenched field plate contact which is filled with a contact metal plug. That is, in the termination area, the trenched field plate is formed not only along trench sidewall of the wide termination trench but also on trench bottom of the wide termination trench by doping poly CMP instead of dry poly etch used by the aforementioned prior arts so that the portion of the trenched field plate on the trench bottom of the wide termination trench can be acted as a block layer during a blank body ion implantation without requiring a body mask to avoid formation of an additional body region underneath the wide termination trench causing early avalanche in the termination area. It means that the body region can be formed in the active area by the blank body ion implantation without having the early avalanche issue, and the punch-through issue due to the boron segregation encountered in the prior art of U.S. Pat. No. 6,396,090, therefore, an improved termination structure for semiconductor power devices is realized having the capability of sustaining a high breakdown voltage and reducing the manufacturing cost because no body mask or extra block layer is needed.

According to the present invention, in the termination area of some preferred embodiments, the wide termination trench which is extending from the boundary of the active area can be further extending to a device edge which is illustrated as a scribe line for example in FIG. 2A wherein the trenched field plate has a L shape structure. In the termination area of some other preferred embodiments, the wide termination trench which is extending from the boundary of the active area is not extending to the device edge for example in FIG. 2B wherein the trenched field plate has an U shape structure, that is to say, the wide termination trench has a trench bottom ended within the device edge.

According to the present invention, in some preferred embodiments, the trenched gates in the active area each comprises a single electrode padded by a gate insulating layer and formed in an active trench. In some other preferred embodiments, the trenched gates in the active area can be implemented by each comprising a shielded electrode in a lower portion and a gate electrode in an upper portion, for example in FIG. 4, wherein the shielded electrode is insulated from the semiconductor layer by a shielded insulating layer, the gate electrode is insulated from the semiconductor layer by a gate insulating layer, the shielded electrode and the gate electrode is insulated from each other by an inter-poly insulating layer formed therebetween, wherein the shielded insulating layer has a greater thickness than the gate insulating layer.

According to the present invention, in some preferred embodiments, especially in the case of a trench MOSFET, the top electrode which is connected to the trenched field plate is a source metal which is also connected to a source region and a body region of the active area at the same time. Specifically, the trenched field plate contact which is filled with a contact metal plug is penetrating through the inter-insulating layer and extending into the trenched field plate, the source region and the body region of the active area is shorted to the source metal through a trenched source-body contact which is filled with the contact metal plug while penetrating through the inter-insulating layer, the source region and extending into the body region. Wherein, the contact metal plug can be implemented by using a tungsten metal layer padded by a barrier layer of Ti/TiN or Co/TiN.

According to the present invention, in some preferred embodiments, especially in the case of a trench MOSFET, the top electrode which is connected to the trenched field plate is a gate metal which is also shorted to a gate connection trenched gate for gate connection for the semiconductor power devices. Specifically, the trenched field plate contact which is filled with a contact metal plug is penetrating through the inter-insulating layer and extending into the trenched field plate, the gate connection trenched gate is shorted to the gate metal through a trenched gate contact which is filled with the contact metal plug while penetrating through the inter-insulating layer and extending into the gate connection trenched gate. Wherein, the contact metal plug can be implemented by using a tungsten metal layer padded by a barrier layer of Ti/TiN or Co/TiN. Furthermore, as illustrated in FIG. 3, the wide termination trench has a trench width Twt which is greater than 1.0 um, a gate connection trench in which the gate connection trenched gate is formed has a trench width Twg, and the active trench in which each of the trenched gates in the active area is formed has a trench with Twa, wherein Twt is greater than Twg which is greater than Twa.

According to the present invention, in some preferred embodiments, especially in the case of a trench Schottky rectifier, the top electrode which is connected to the trenched field plate is an anode metal which is also connected to the semiconductor layer. Specifically, the trenched field plate contact which is filled with a contact metal plug is penetrating through the inter-insulating layer and extending into the trenched field plate, the semiconductor layer is shorted to the anode metal through a trenched Schottky contact which is filled with the contact metal plug while penetrating through the inter-insulating layer and extending into the semiconductor layer between two adjacent trenched gates in the active area to form a Schottky rectifier layer along sidewall and bottom of the trenched Schottky contact interfaced with the semiconductor layer. Wherein, the contact metal plug can be implemented by using a tungsten metal layer padded by a barrier layer of Ti/TiN or Co/TiN. Furthermore, in some other preferred embodiments, the sidewall of trenched Schottky contact along which the Schottky rectifier layer is formed is surrounded by a Schottky barrier height enhancement region to optimize Vf (forward voltage) and Ir (reverse current). Wherein, the Schottky barrier height enhancement region can be implemented to have a conductive type which is the same as or opposite to the semiconductor layer.

According to the present invention, in some preferred embodiment, all kinds of trenches including the active trenches in the active area, the gate connection trench for gate connection and the wide termination trench in the termination area, for example in FIG. 2C, each has a trench bottom surrounded by a doped region which is formed to reduce Rds (the resistance between drain and source). In the case of an N-channel trench MOSFET, the doped region can be an n* region which has a same conductive doping type and a greater doping concentration compared with an N epitaxial layer which is extending over an N+ substrate to constitute the semiconductor layer.

It is therefore another aspect of the present invention to provide a method of manufacturing a semiconductor power device with an improved termination area structure. The method comprises: forming a wide termination trench in a semiconductor layer in the termination area structure; forming a termination insulating layer along trench bottom and trench sidewall of the wide termination trench; and forming a trenched field plate onto the termination insulating layer and covering the trench sidewall and the trench bottom of the wide termination trench in the termination area structure. Wherein the trenched field plate is formed by doing poly silicon CMP.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the semiconductor power device described herein can be trench MOSFET, trench IGBT, trench Schottky rectifier or integrated circuit selected therefrom. It is also to be understood that the features of the various exemplary embodiments described herein may be combined with each other, unless specifically noted otherwise.

Figure 1A:
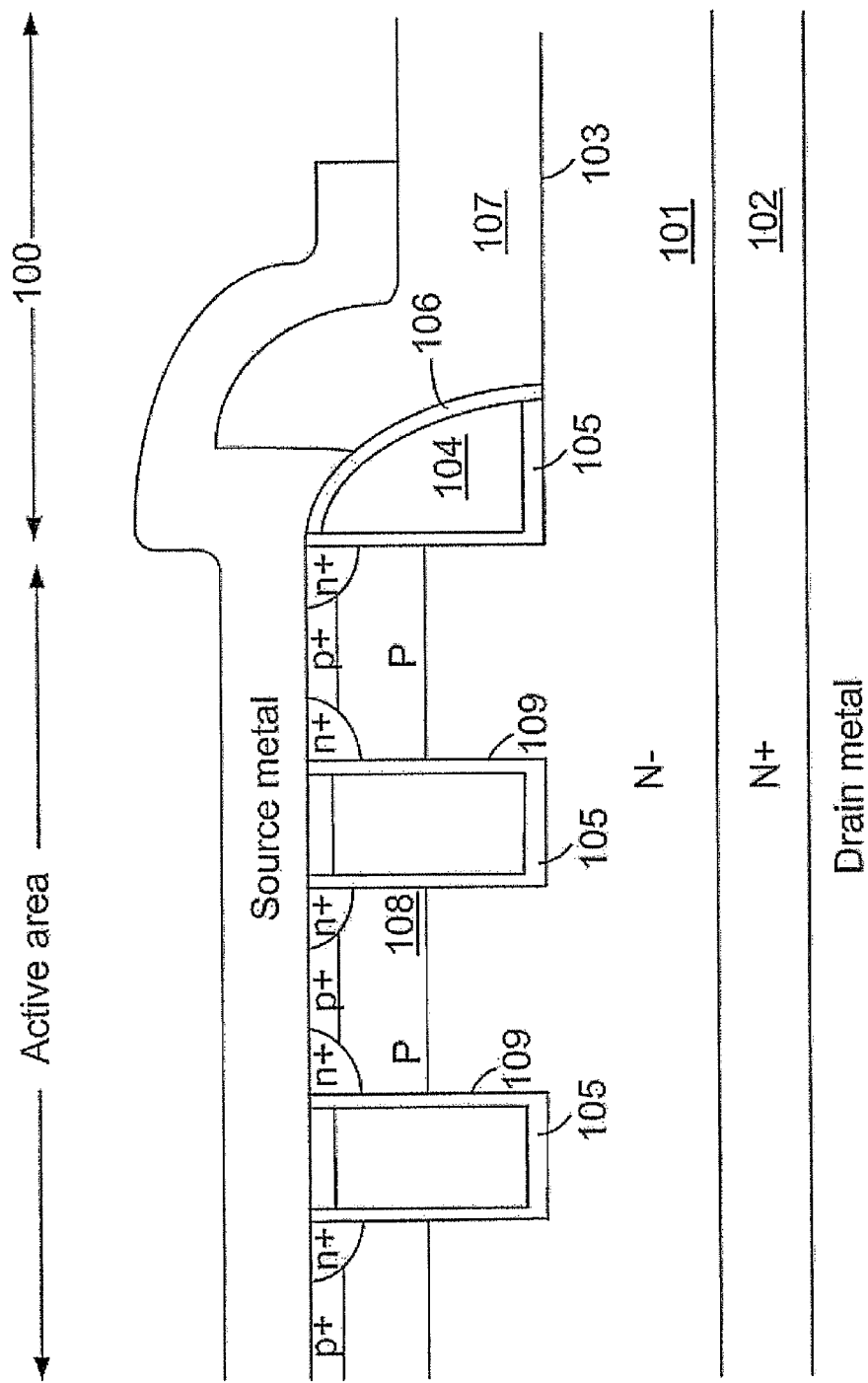
FIG. 1A is a cross-sectional view of a MOS device with a termination area structure disclosed in prior art.
Figure 1B:
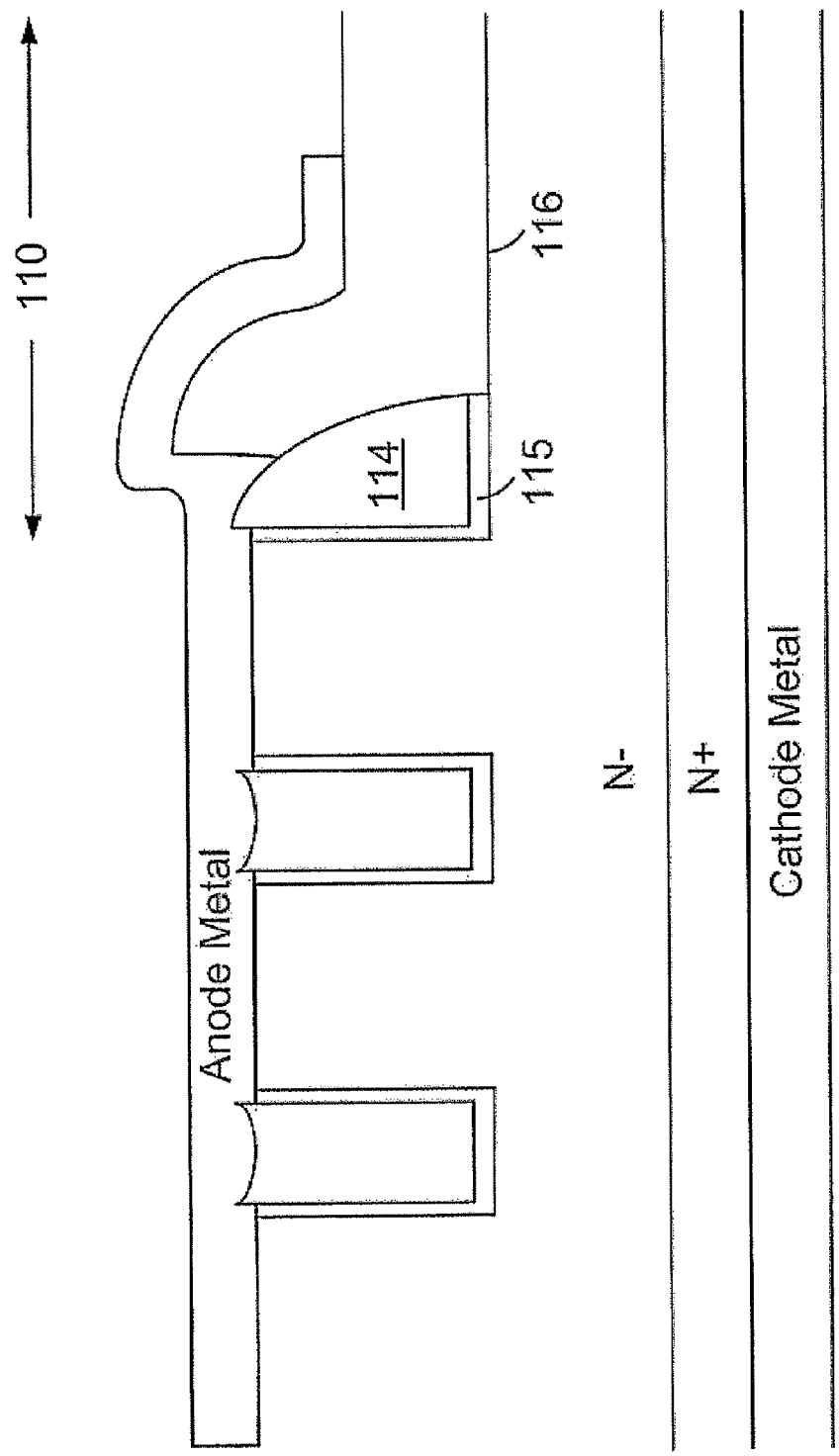
FIG. 1B is a cross-section view of a trench Schottky rectifier with a termination area structure disclosed in prior art.
Figure 1C:
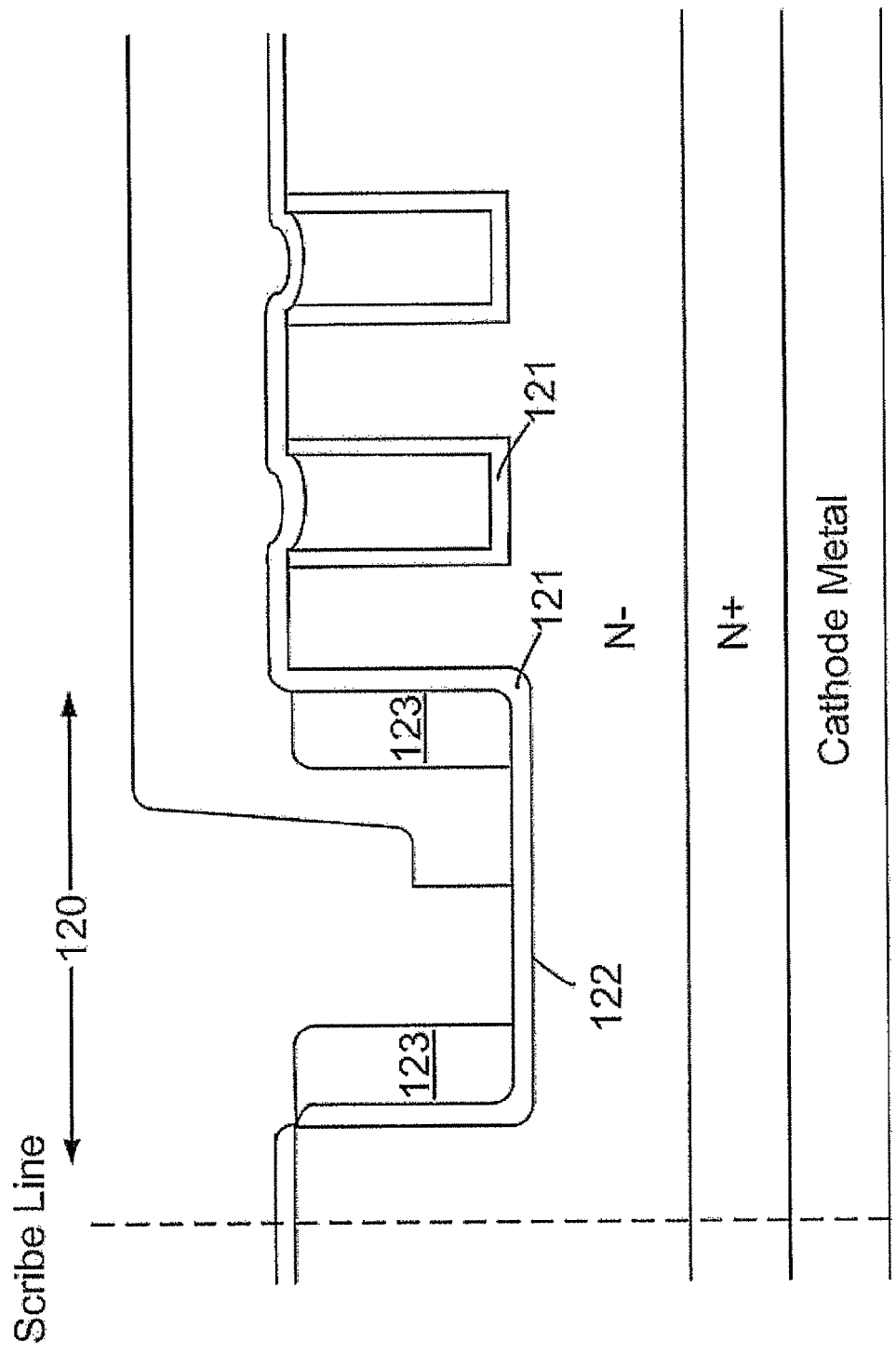
FIG. 1C is a cross-section view of another trench Schottky rectifier with a termination area structure disclosed in prior art.
Figure 1D:
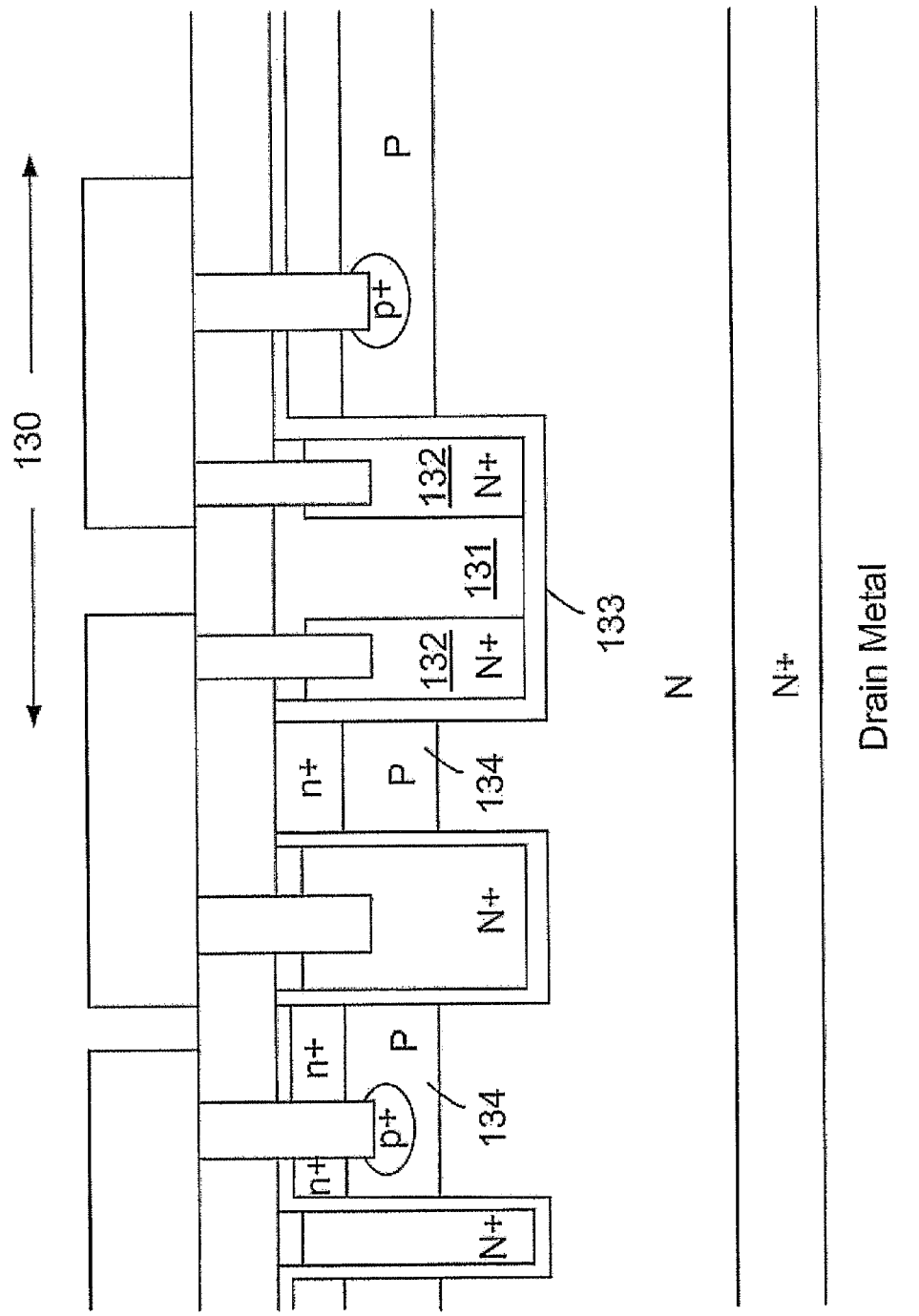
FIG. 1D is a cross-section view of a trench MOSFET with a termination area structure disclosed in prior art.
Figure 2A:
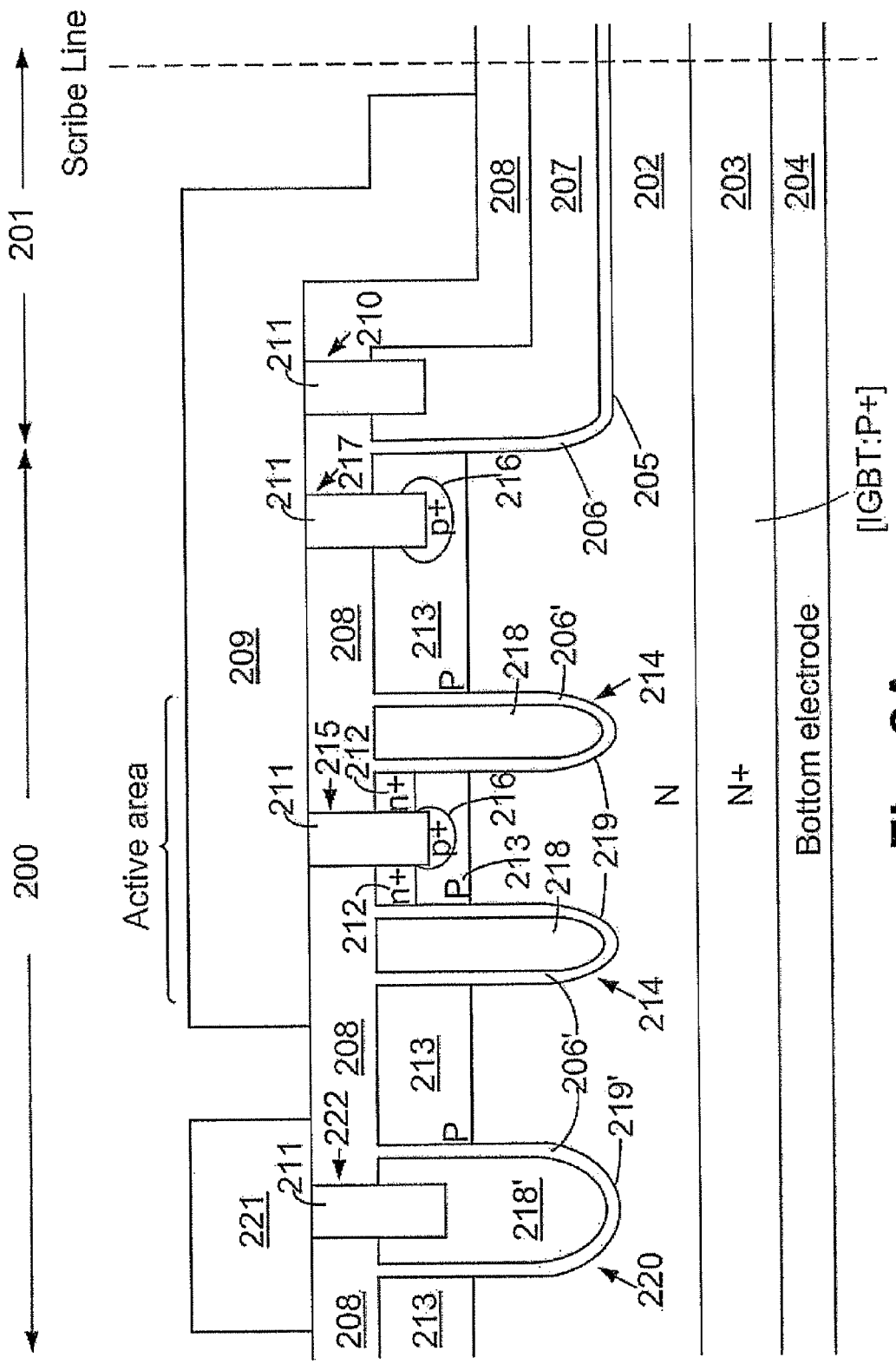
FIG. 2A is a cross-section view of a preferred embodiment according to the present invention.

Please refer to FIG. 2A for a preferred embodiment of this invention. FIG. 2A shows an N-channel trench MOSFET comprising an area 200 including an active area and trenched gate contact area, and an improved termination area structure 201 formed in a semiconductor layer comprising an N epitaxial layer 202 extending over a heavily doped N+ substrate 203 coated with a back metal of Ti/Ni/Ag on the rear side as a bottom electrode 204 for drain contact. In the case of forming an N-channel IGBT, the substrate can be prepared as a P type substrate. The termination area structure 201 further comprises: a wide termination trench 205 extending from a boundary of the active area across a device edge (illustrated as a scribe line); a termination insulating layer 206 along trench sidewall and trench bottom of the wide termination trench 205; a trenched field plate 207 having a L shape structure formed onto the termination insulating layer and covering the trench sidewall and the trench bottom of the wide termination trench 205; an inter-insulating layer 208 covering outer surface of the trenched field plate 207. The trenched field plate 207 is connected to a top electrode which is a source metal 209 in this preferred embodiment through a trenched field plate contact 210 which is filled with a contact metal plug 211 while penetrating through the inter-insulating layer 208 and extending into the trenched field plate 207. The source metal 209 and the inter-insulating layer 208 are further extending atop an active area of the N-channel trench MOSFET wherein the source metal 209 is shorted to an n+ source region 212 and a P body region 213 between a pair of trenched gates 214 in the active area through a trenched source-body contact 215 which is filled with the contact metal plug 211 while penetrating through the inter-insulating layer 208, the n+ source region 212 and extending into the P body region 213. In order to reduce the contact resistance between the contact metal plug 211 and the P body region 213, a p+ body ohmic doped region 216 is formed wrapping bottom and sidewall of the trenched source-body contact 215 underneath the n+ source region 212. At the same time, the P body region 213 between the termination area structure 201 and the active area, having a junction depth shallower than the wide termination trench 205 is also shorted to the source metal 209 through a trenched body contact 217 which is filled with the contact metal plug 211 while penetrating through the inter-insulating layer 208 and extending into the P body region 213 between the termination area structure 201 and the active area, wherein bottom and a part of sidewall of the trenched body contact 217 are also surrounded by the p+ body ohmic doped region 216. According to this preferred embodiment, the trenched gates 214 in the active area each comprises a single electrode 218 padded by a gate insulating layer 206' and formed in an active trench 219, wherein the gate insulating layer 206' is formed simultaneously with the termination insulating layer 206. The N-channel trench MOSFET further comprises a gate connection trenched gate 220 in the trenched gate contact area for gate connection of the trench MOSFET, wherein the gate connection trenched gate 220 is shorted to a gate metal 221 atop the inter-insulating layer 208 and separated from the source metal 209 through a trenched gate contact 222 which is filled with the contact metal plug 211 while penetrating through the inter-insulating layer 208 and extending into a wide single electrode 218' which is padded by the gate insulating layer 206' formed in a gate connection trench 219' and comprised in the gate connection trenched gate 220. Wherein, the trenched field plate 207, the single electrode 218 and the wide single electrode 218' can be implemented by using a same doped poly-silicon layer, the contact metal plug 211 can be implemented by using a tungsten metal layer padded by a barrier layer of Ti/TiN or Co/TiN.

Figure 2B:
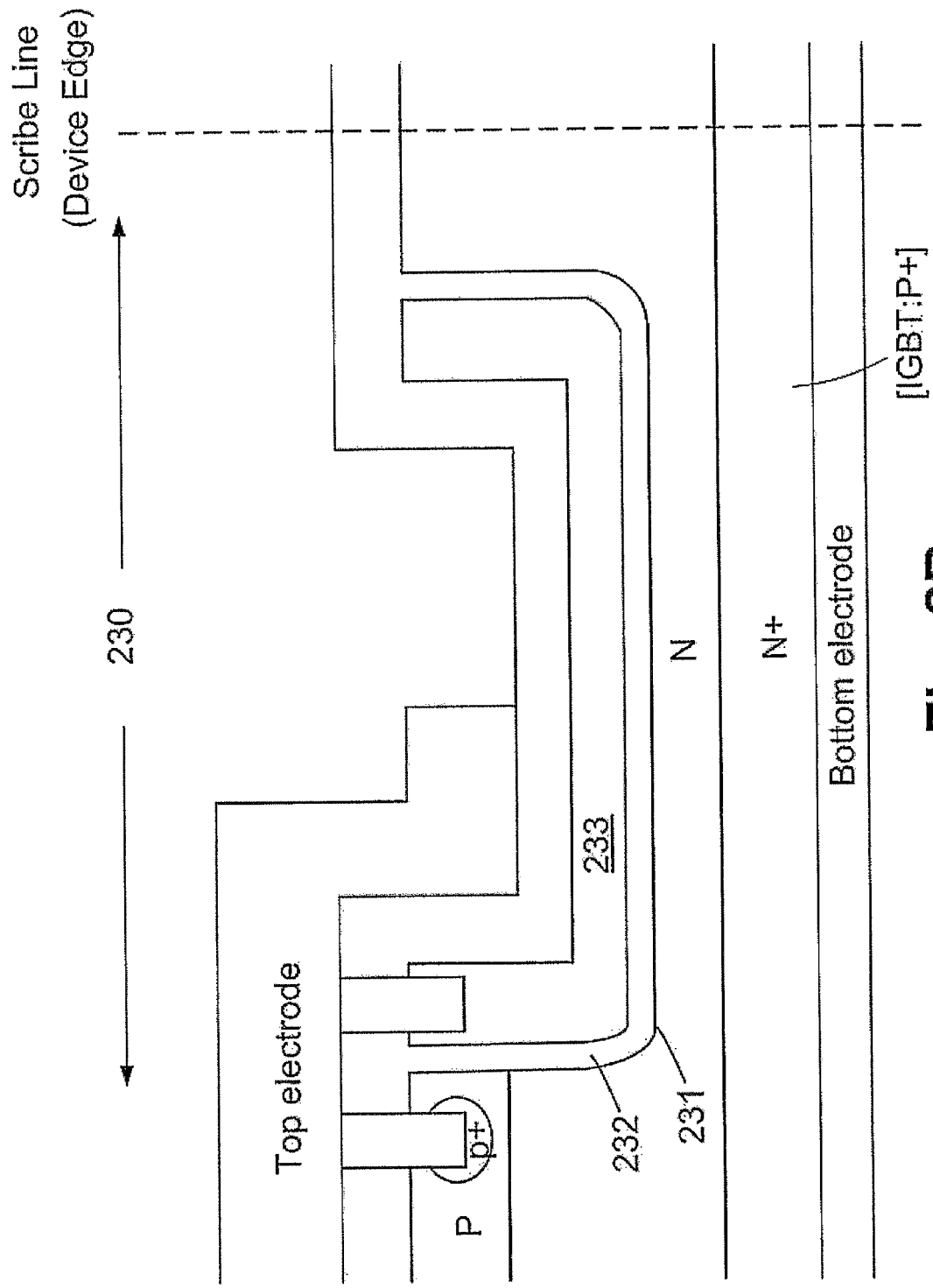
FIG. 2B is a cross-section view of another preferred embodiment according to the present invention.

FIG. 2B shows a termination area structure 230 of another preferred embodiment according to this invention where the portion of the semiconductor power device is similar with that in FIG. 2A. The difference between the termination area structure 230 in FIG. 2B and the termination area structure 202 in FIG. 2A is that, the termination area structure 230 comprises a wide termination trench 231 which is extending from a boundary of the active area towards but not to a device edge, which is to say, the wide termination trench 231 has a trench bottom ended within the device edge. Accordingly, the termination area structure 230 further comprises a termination insulating layer 232 and a trenched fielded plate 233 with an U shape structure thereon covering the whole trench sidewall and the whole trench bottom of the wide termination trench 231.

Figure 2C:
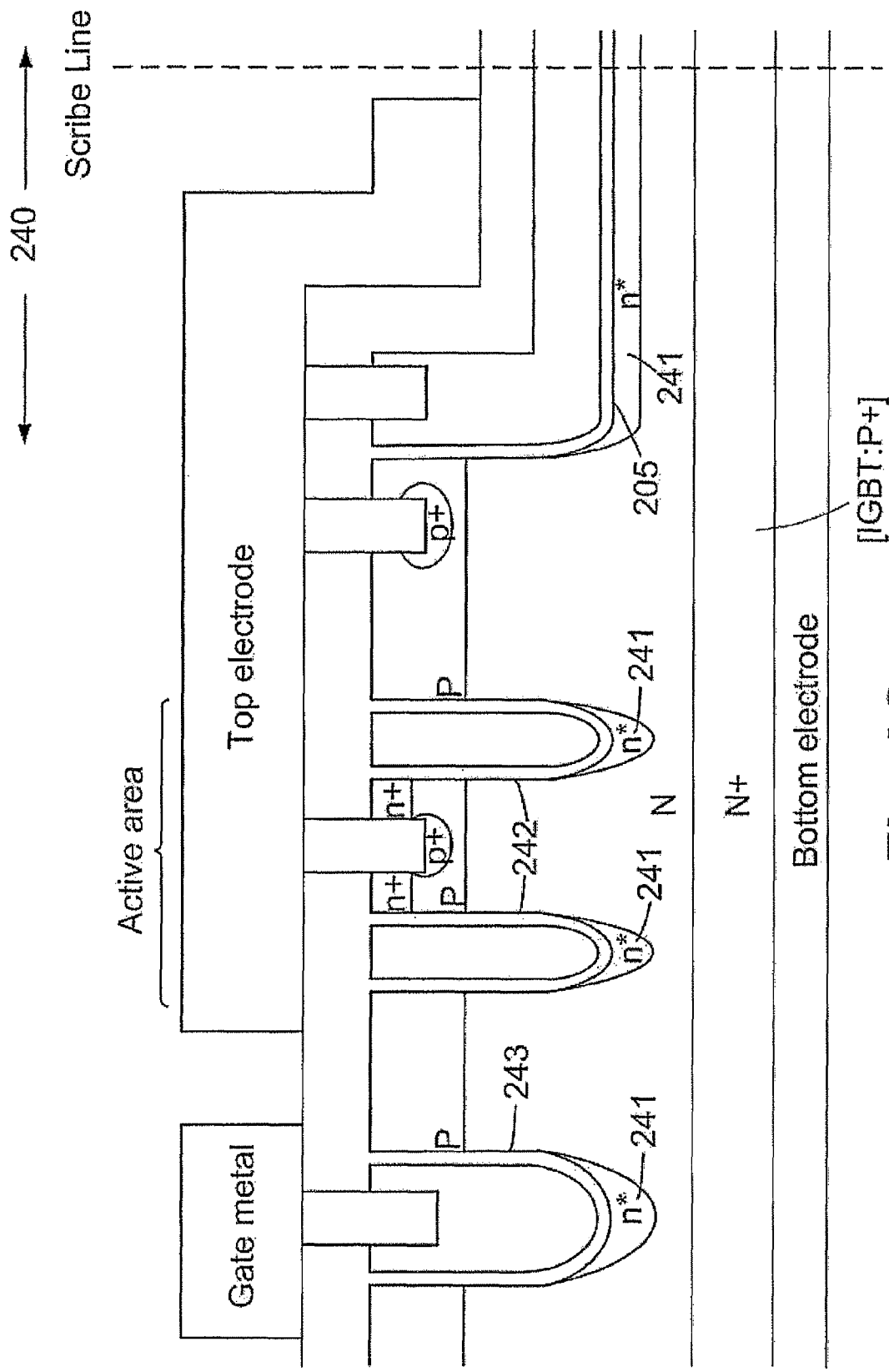
FIG. 2C is a cross-section view of another preferred embodiment according to the present invention.

FIG. 2C shows another preferred embodiment according to the present invention which has a similar configuration with that in FIG. 2A except that, an n* doped region (or a p* doped region in a P-channel semiconductor power device) 241 having doping concentration higher than the epitaxial layer, is formed surrounding each trench bottom of all kinds of trenches including a wide termination trench 242 in a termination area structure 240, active trenches 242 in an active area, and a gate connection trench 243 in a gate contact area, to mainly reduce Rds of the trench MOSFET.

Figure 2D:
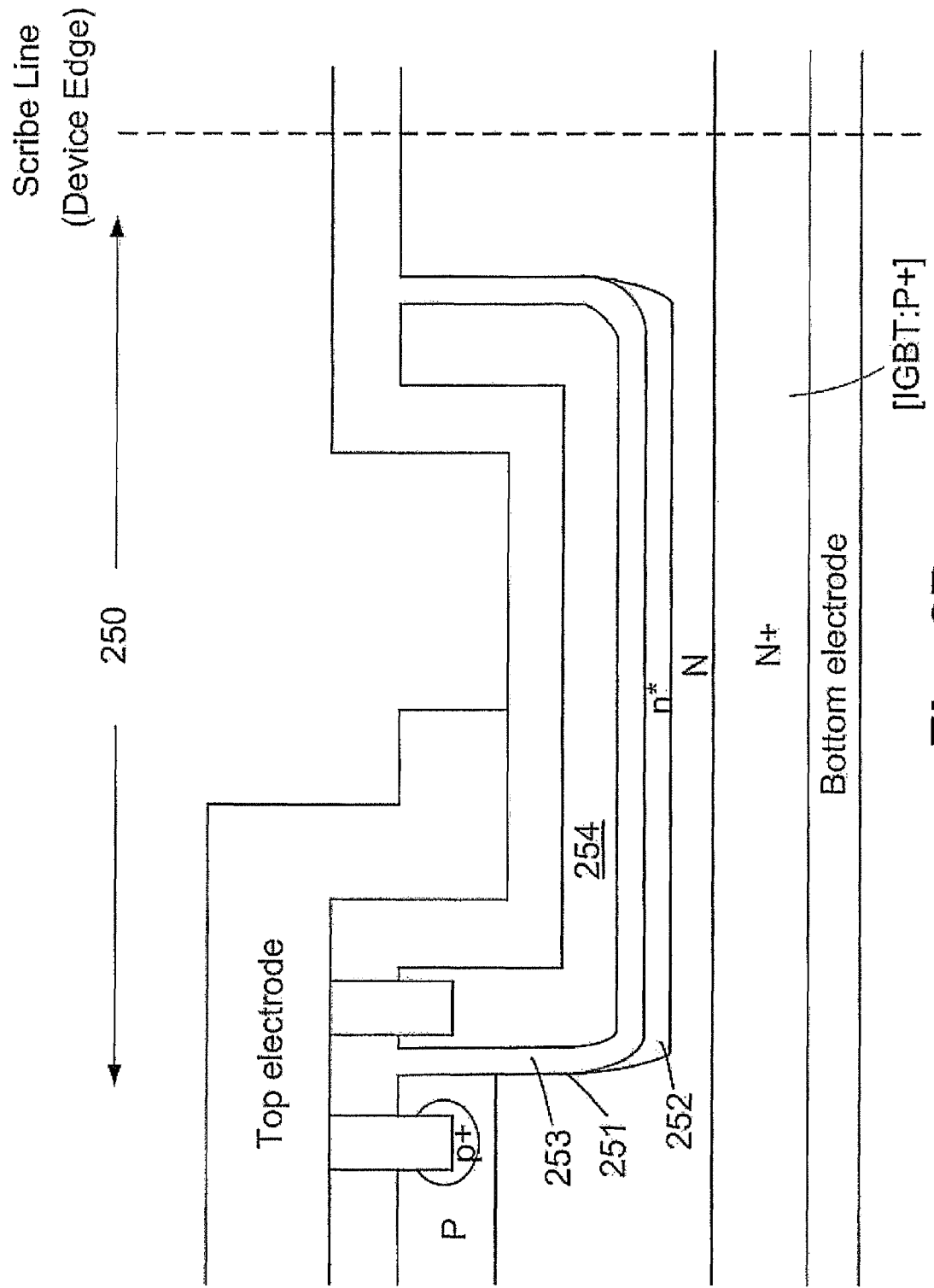
FIG. 2D is a cross-section view of another preferred embodiment according to the present invention.

FIG. 2D shows a termination area structure 250 of another preferred embodiment according to the present invention where the portion of the semiconductor power device is similar with that in FIG. 2C which has an n* doped region with a doping concentration higher than the epitaxial layer surrounding each trench bottom of all kinds of trenches. However, the termination area structure 250 comprises a wide termination trench 251 which is extending towards but not to a device edge, which is to say, the wide termination trench 251 has a trench bottom ended within the device edge. Accordingly, the n* doped region 252 is surrounding the whole trench bottom of the wide termination trench 251 and is also ended within the device edge. Again, the termination area structure 250 further comprises a termination insulating layer 253 and a trenched fielded plate 254 thereon covering the whole trench sidewall and the whole trench bottom of the wide termination trench 251.

Figure 3:
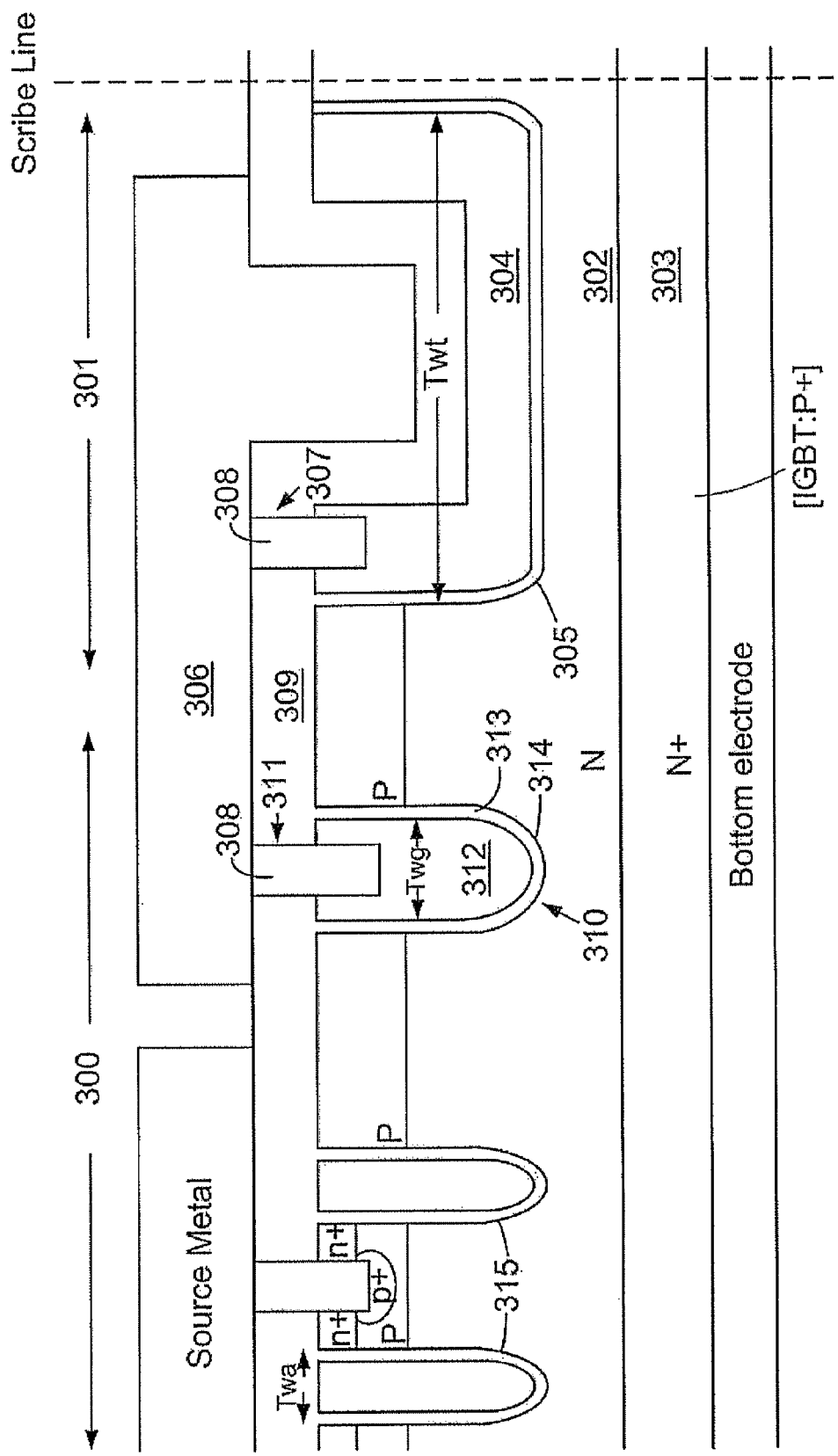
FIG. 3 is a cross-section view of another preferred embodiment according to the present invention.

Please refer to FIG. 3 for another preferred embodiment of this invention showing an N-channel trench MOSFET with an improved termination area structure 301 formed in a semiconductor layer comprising an N epitaxial layer 302 extending over a heavily doped N+ substrate 303 coated with a back metal of Ti/Ni/Ag on the rear side as a bottom electrode for drain contact. In the case of forming an N-channel IGBT, the substrate can be prepared as a P type substrate. In this preferred embodiment, the termination area structure 301 is similar with that in FIG. 2B except that, the termination area structure 301 comprises a trenched field plate 304 formed in a wide termination trench 305 and shorted to a top electrode which is a gate metal 306 instead of a source metal shown in FIG. 2B, through a trenched field contact 307 which is filled with a contact metal plug 308 while penetrating through an inter-insulating layer 309 and extending into the trenched field plate 304. The gate metal 306 is further shorted to a gate connection trenched gate 310 for gate connection of the N-channel trench MOSFET through a trenched gate contact 311 which is filled with the contact metal plug 308 while penetrating through the inter-insulating layer 309 and extending into a wide single electrode 312 which is padded by a gate insulating layer 313 formed in a gate connection trench 314 and comprised in the gate connection trenched gate 310. Specified, the wide termination trench 305 has a trench width Twt greater than 1.0 um, the gate connection trench 314 has a trench width Twg and active trenches 315 each has a trench with Twa, wherein Twt is greater than Twg which is greater than Twa.

Figure 4:
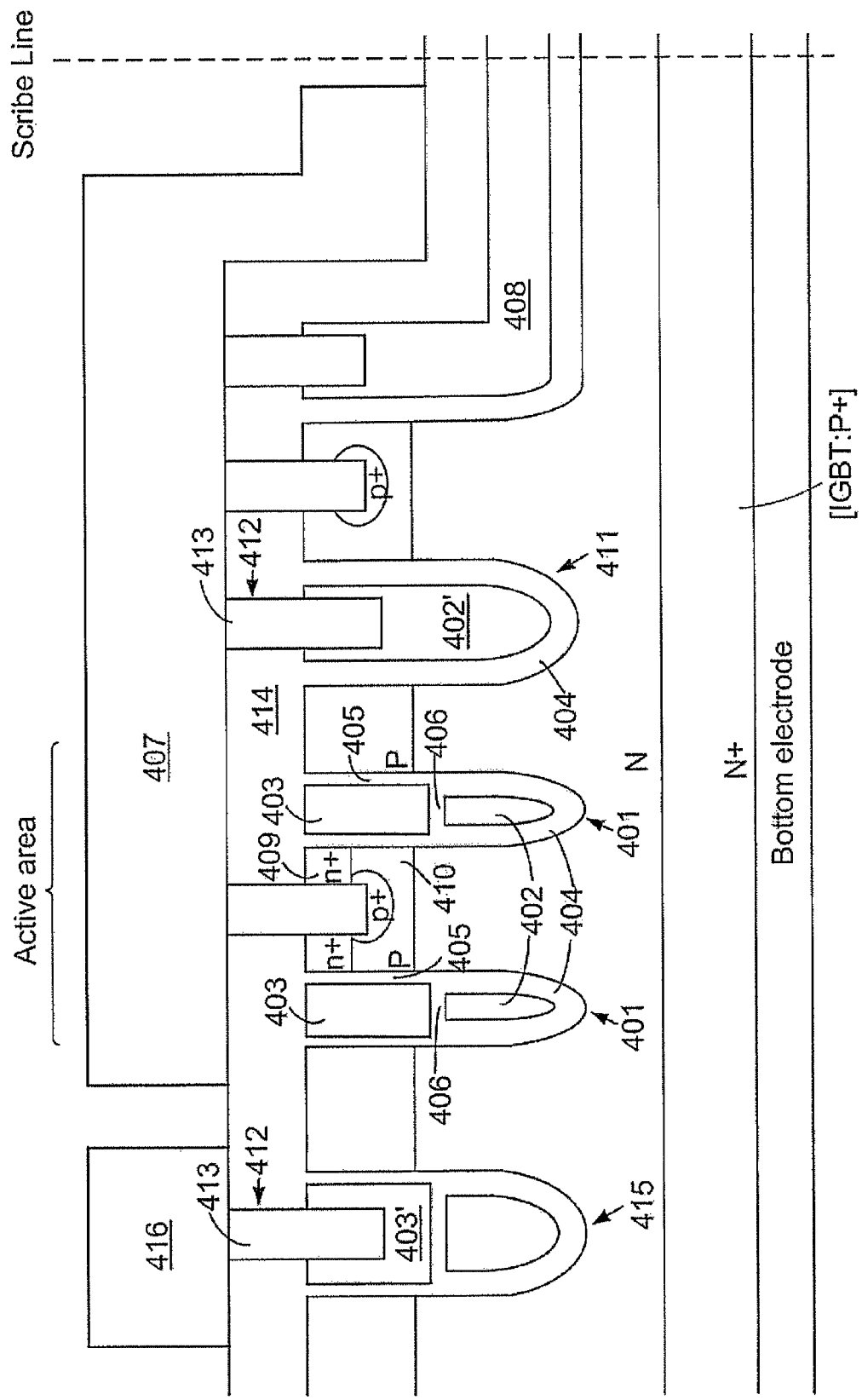
FIG. 4 is a cross-section view of another preferred embodiment according to the present invention.

FIG. 4 shows another preferred embodiment of a semiconductor power device with an improved termination area structure according to the present invention which is similar with that in FIG. 2A except that, in an active area of the semiconductor power device, a plurality of trenched gates 401 are formed each having a shielded gate structure comprising a shielded electrode 402 in a lower portion and a gate electrode 403 in an upper portion, wherein the shielded electrode 402 is insulated from the semiconductor layer by a shielded insulating layer 404, the gate electrode 403 is insulated from the semiconductor layer by a gate insulating layer 405, and the shielded electrode 403 is insulated from the gate electrode 403 by an inter-poly insulating layer 406, wherein the shielded insulating layer 404 has a greater thickness than the gate insulating layer 405. Meanwhile, each the shielded electrode 402 is shorted to a source metal 407 through a shielded electrode trenched gate 411 comprising a single shielded electrode 402' formed simultaneously with the shielded electrode 402 and padded by the shielded insulating layer 404, wherein the single shielded electrode 402' is shorted to the source metal 407 through a trenched shielded electrode contact 412 which is filled with a contact metal plug 413 while penetrating through an inter-insulating layer 414 and extending into the single shielded electrode 402'. Meanwhile, the source metal 407 is simultaneously shorted to a trenched field plate 408 in the termination area structure while shorted to a source region 409 and a body region 410 in an active area. At the same time, the semiconductor power device further comprises a gate connection trenched gate 415 having a same shielded gate structure as the trenched gates 401 in the active area, in which a wide gate electrode 403' in an upper portion of the connection trenched gate 415 is shorted to a gate metal 416 through a trenched gate contact 417 which is filled with the contact metal plug 413 while penetrating through the inter-insulating layer 414 and extending into the wide gate electrode 403'.

Figure 5:
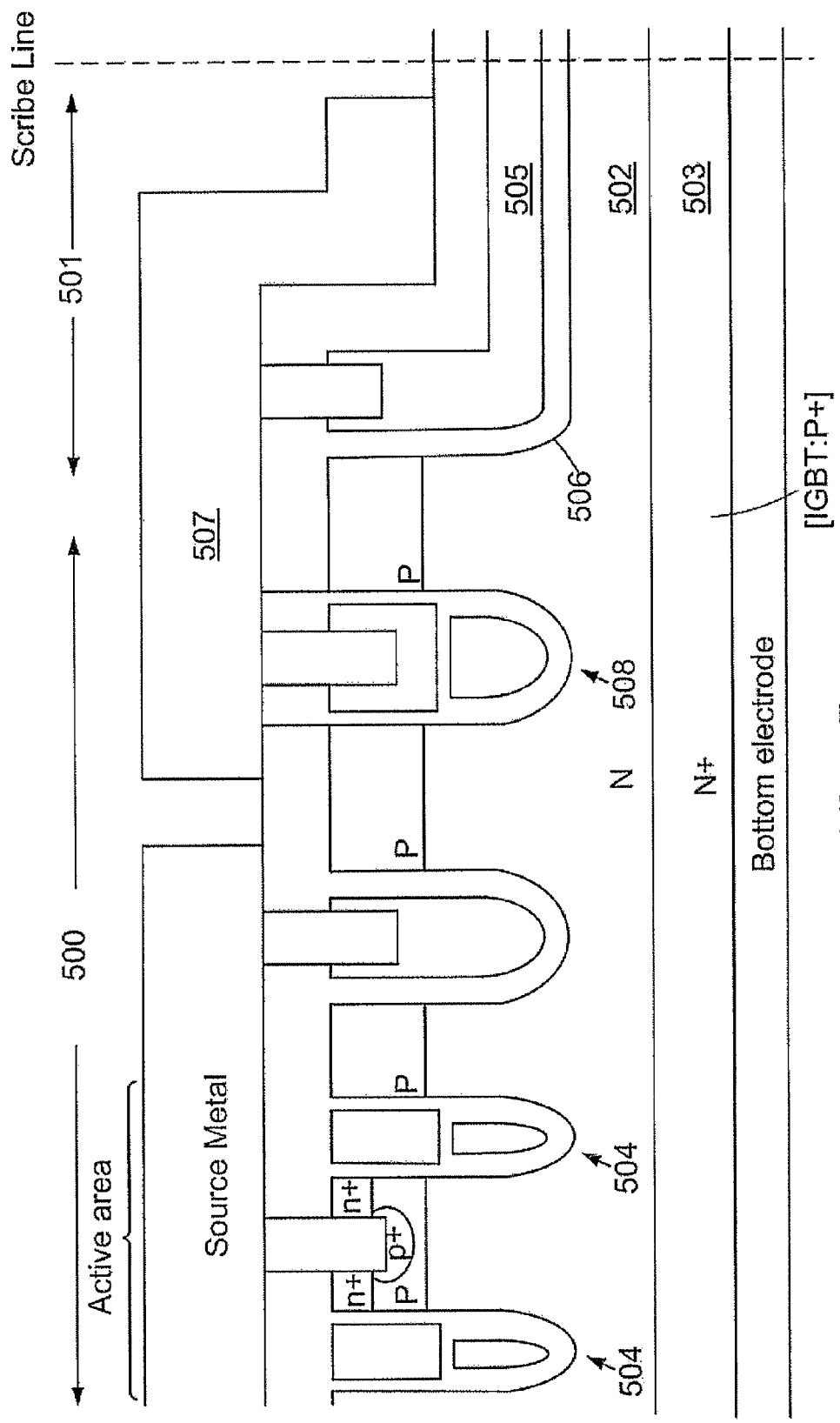
FIG. 5 is a cross-section view of another preferred embodiment according to the present invention.

Please refer to FIG. 5 for another preferred embodiment of this invention showing an N-channel trench MOSFET with an improved termination area structure 501 formed in a semiconductor layer comprising an N epitaxial layer 502 extending over a heavily doped N+ substrate 503 coated with a back metal of Ti/Ni/Ag on the rear side as a bottom electrode for drain contact. In the case of forming an N-channel IGBT, the substrate can be prepared as a P type substrate. According to the preferred embodiment, the N-channel trench MOSFET has a similar configuration with that in FIG. 4 wherein a plurality of trenched gates 504 in an active area each has a shielded gate structure. However, in the termination area structure 501 where a trenched field plate 505 is formed covering trench bottom and trench sidewall of a wide termination trench 506, the trenched field plate 505 is shorted to a top electrode which is a gate metal 507 in this embodiment instead of a source metal in FIG. 4. Therefore, a gate connection trenched gate 508 used to be shorted to the gate metal 507 for gate connection of the N-channel trench MOSFET is located adjacent to the termination area 501, which is different to FIG. 4 where the gate connection trenched gate 415 is located adjacent to the active area on an opposite side to the termination area structure.

Figure 6A:
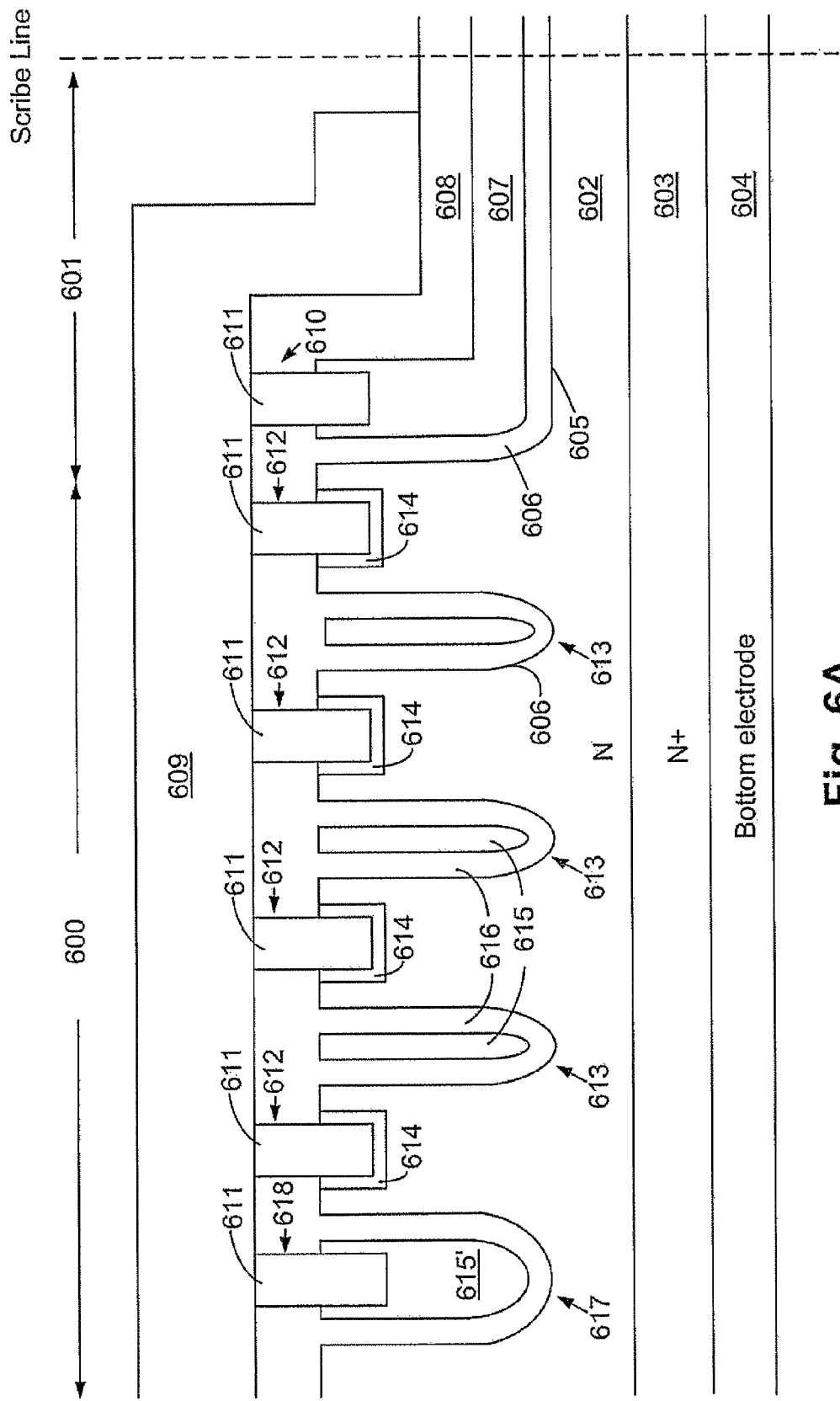
FIG. 6A is a cross-section view of another preferred embodiment according to the present invention.

Please refer to FIG. 6A for another preferred embodiment of this invention showing a trench Schottky rectifier comprises an active area 600 and an improved termination area structure 601 formed in a semiconductor layer comprising an N epitaxial layer 602 extending above a heavily doped N+ substrate 603 coated with a back metal on rear side as a bottom electrode 604 for cathode contact. The termination area structure 601 further comprises: a wide termination trench 605 extending from a boundary of the active area 600 across a device edge (illustrated as a scribe line); a termination insulating layer 606 along trench sidewall and trench bottom of the wide termination trench 605; a trenched field plate 607 formed onto the termination insulating layer 606 and covering the trench sidewall and the trench bottom of the wide termination trench 605; an inter-insulating layer 608 covering outer surface of the trenched field plate 607. The trenched field plate 607 is shorted to a top electrode which is an anode metal 609 in this preferred embodiment through a trenched field plate contact 610 which is filled with a contact metal plug 611 while penetrating through the inter-insulating layer 608 and extending into the trenched field plate 607. The anode metal 609 and the inter-insulating layer 608 are further extending atop the trench Schottky rectifier 600 wherein the anode metal 609 is shorted to the semiconductor layer through a trenched Schottky contact 612 which is filled with the contact metal plug 611 while penetrating through the inter-insulating layer 608 and extending into the N epitaxial layer 602 between a pair of trenched gates 613 to form a Schottky rectifier layer 614 along bottom and sidewall of the trenched Schottky contact 612 interfaced with the N epitaxial layer 602. Each of the trenched gates 613 comprises a single electrode 615 which is padded by a gate insulating layer 616 and shorted to the anode metal 609 through a wide single electrode 615' which is comprised in a gate connection trenched gate 617 and shorted to the anode metal 609 through a trenched gate contact 618 which is filled with the contact metal plug 611 while penetrating through the inter-insulating layer 608 and extending into the wide single electrode 615'.

Figure 6B:
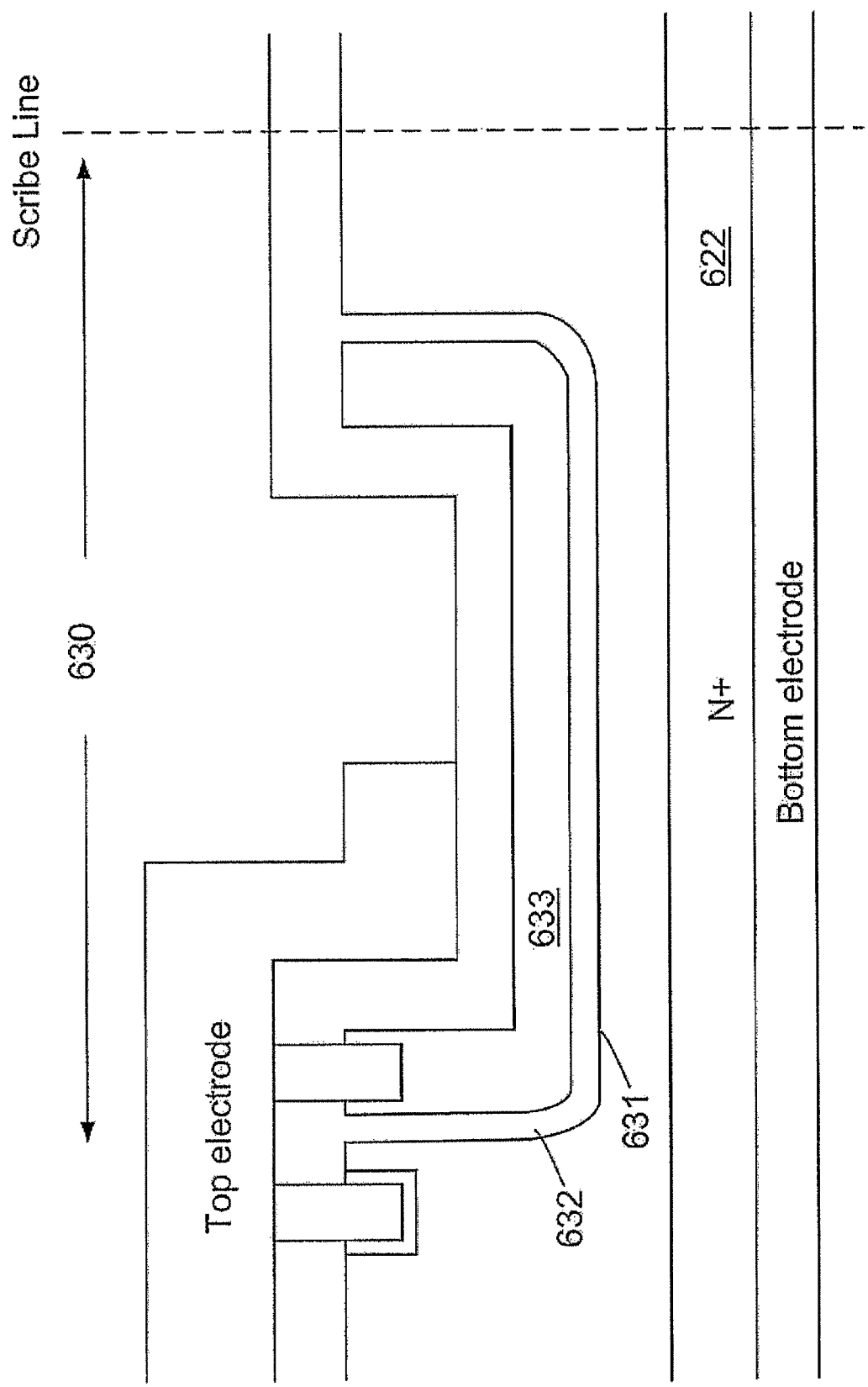
FIG. 6B is a cross-section view of another preferred embodiment according to the present invention.

FIG. 6B shows a termination area structure 630 of another preferred embodiment according to this invention where the portion of the semiconductor power device is similar with that in FIG. 6A. The difference between the termination area structure 630 in FIG. 6B and the termination area structure 601 in FIG. 6A is that, the termination area structure 630 comprises a wide termination trench 631 which is extending from a boundary of the active area and not extending to a device edge, which is to say, the wide termination trench 631 has a trench bottom ended within the device edge so that the trenched field plate with an U shape structure is formed. Accordingly, the termination area structure 630 further comprises a termination insulating layer 632 and a trenched fielded plate 633 thereon covering the whole trench sidewall and the whole trench bottom of the wide termination trench 631.

Figure 7:
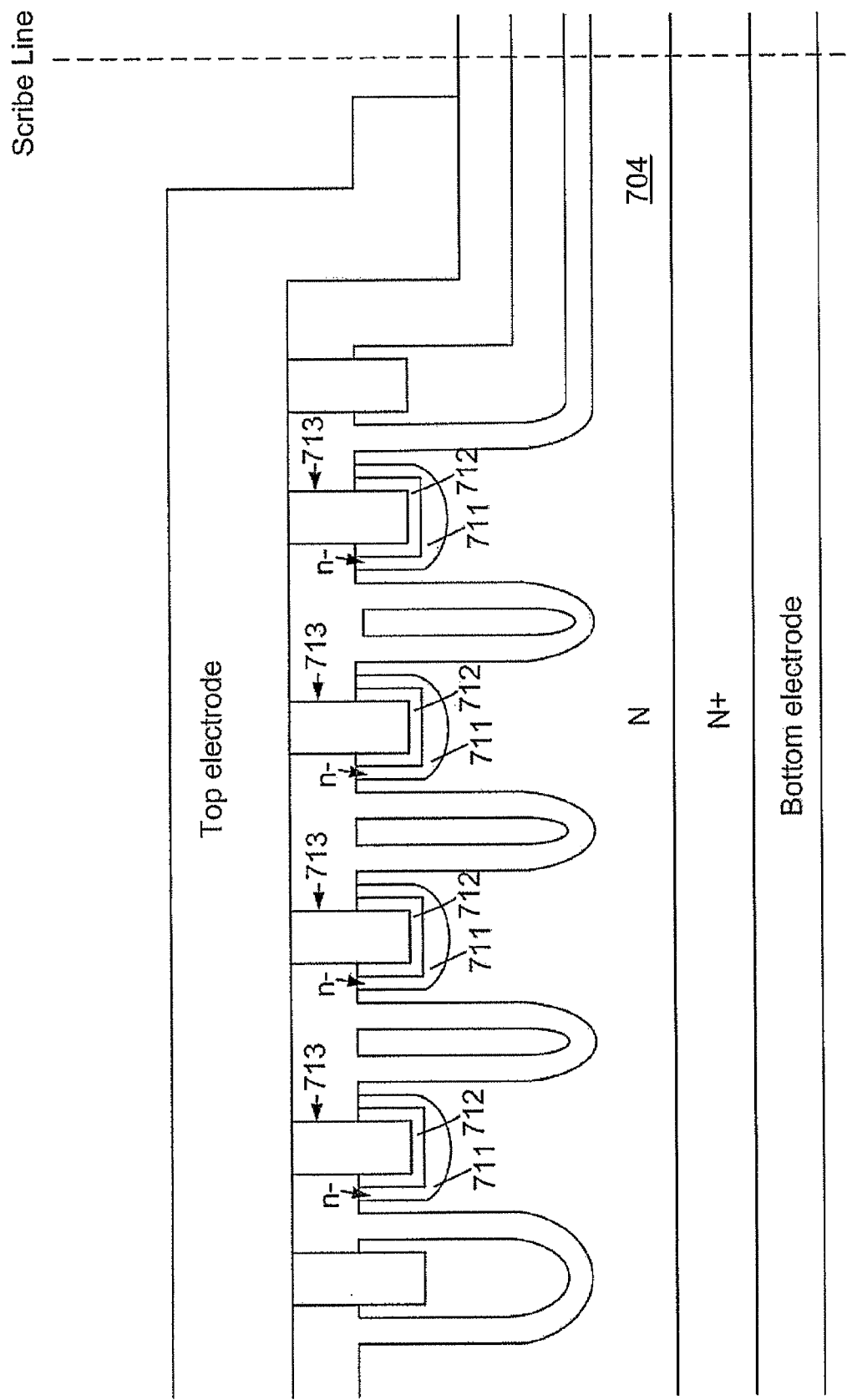
FIG. 7 is a cross-section view of another preferred embodiment according to the present invention.

FIG. 7 is another preferred embodiment of this invention comprising a trench Schottky rectifier and an improved termination area which has a similar structure with that in FIG. 6A except that the trench Schottky rectifier in FIG. 7 further comprises an n− Schottky barrier height enhancement region 711 wrapping the Schottky rectifier layer 712 and surrounding sidewall and bottom of each of the trenched Schottky contact 713 in the N epitaxial layer 704, wherein the n− Schottky barrier height enhancement region 711 has a lower doping concentration than the N epitaxial layer 704 for further enhancing the barrier height of the Schottky rectifier.

Figure 8:
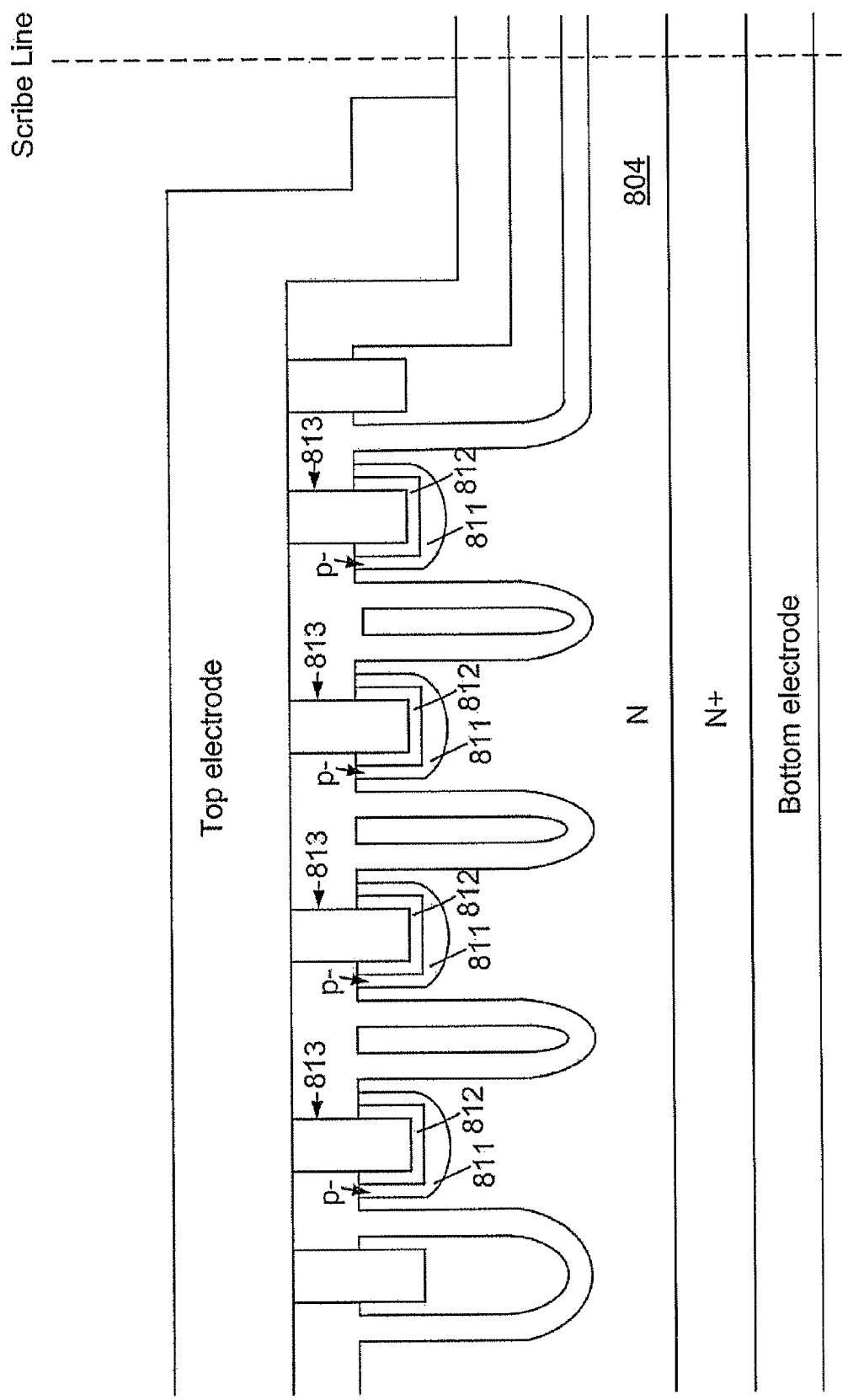
FIG. 8 is a cross-section view of another preferred embodiment according to the present invention.

FIG. 8 is another preferred embodiment of this invention comprising a trench Schottky rectifier and an improved termination area which has a similar structure with that in FIG. 6A except that the trench Schottky rectifier in FIG. 8 further comprises an p− Schottky barrier height enhancement region 811 wrapping the Schottky rectifier layer 812 and surrounding sidewall and bottom of each of the trenched Schottky contact 813 in the N epitaxial layer 804, wherein the p− Schottky barrier height enhancement region 811 has a lower doping concentration than the N epitaxial layer 804 for further enhancing the barrier height of the Schottky rectifier.

Figure 9A:
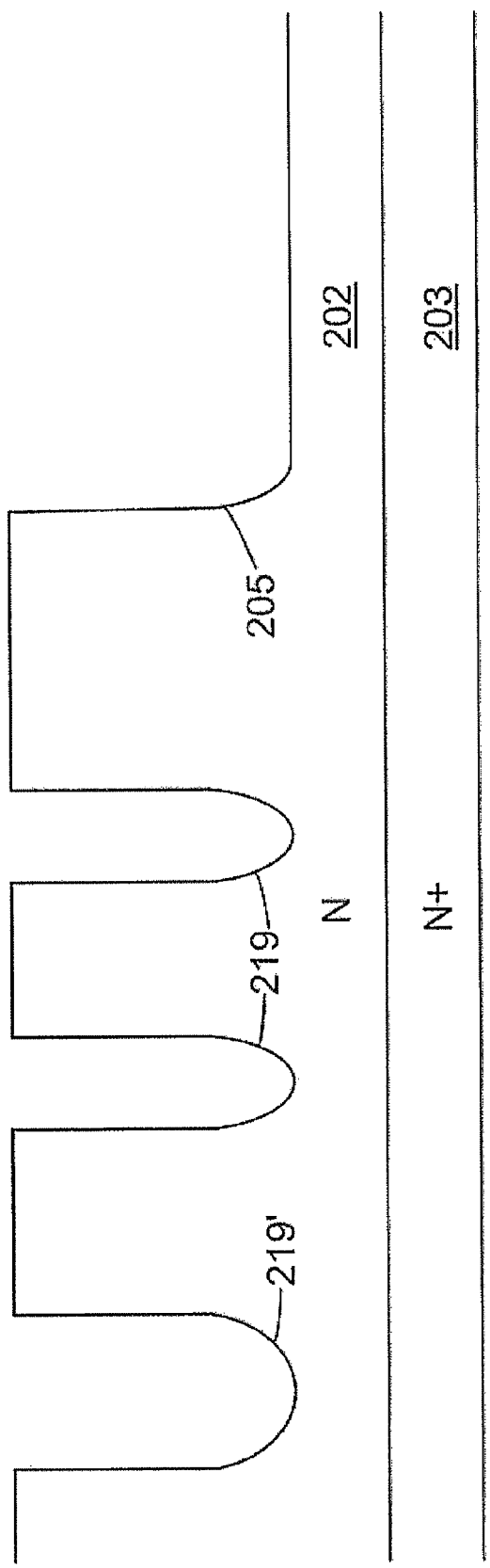
FIGS. 9A to 9F are a serial of side cross sectional views for showing the processing steps for fabricating a semiconductor power device with an improved termination area structure as shown in FIG. 2A.

FIGS. 9A to 9H show a process of manufacturing the trench MOSFET with an improved termination area structure as shown in FIG. 2A. Referring to FIG. 9A, an N epitaxial layer 202 is initially grown on a heavily doped N+ substrate 203. Next, a trench mask (not shown) is applied and followed by a trench etching process to define three kinds of trenches and a plurality of mesas among the three kind of the trenches in the N epitaxial layer 202, including: a wide termination trench 205 in a termination area; a plurality of active trenches 219 in an active area; and a gate connection trench 219' for gate connection in a gate contact area, wherein the wide termination trench 205 has a greater trench width than the gate connection trench 219' which has a greater trench width than the active trenches 219. Then, a sacrificial oxide layer (not shown) is grown and etched to remove the plasma damaged silicon layer formed during the process of opening all kinds of the trenches.

Figure 9B:
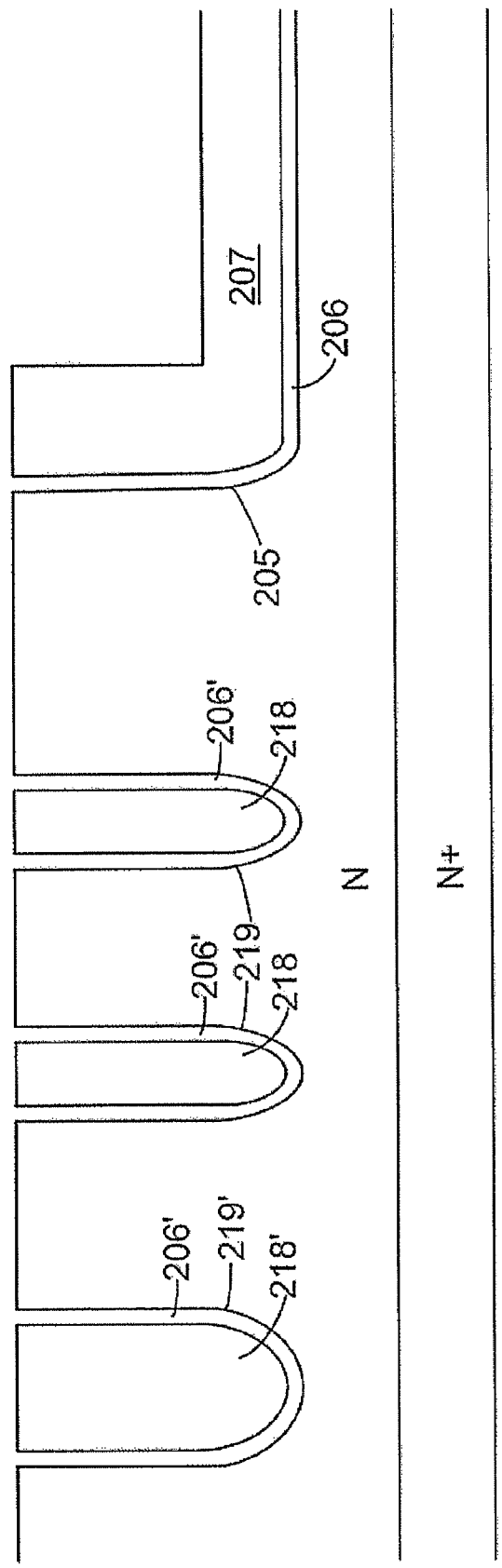

In FIG. 9B, an oxide layer is deposited along inner surface of all kinds of the trenches to respectively act as: a termination insulating layer 206 in the wide termination trench 205; a gate insulating layer 206' in each of the active trenches 219 and the gate connection trench 219'. Then, a doped poly-silicon layer is formed onto the oxide layer and followed by a poly-silicon CMP process to remove the poly-silicon from the top surface of the mesas and leave the necessary portion of the poly-silicon layer within each of the trenches to respectively form: a trenched field plate 219 covering trench bottom and trench sidewall of the wide termination trench 205; a single electrode 218 in each of the active trenches 219; and a wide single electrode 218' in the gate connection trench 219.

Figure 9C:
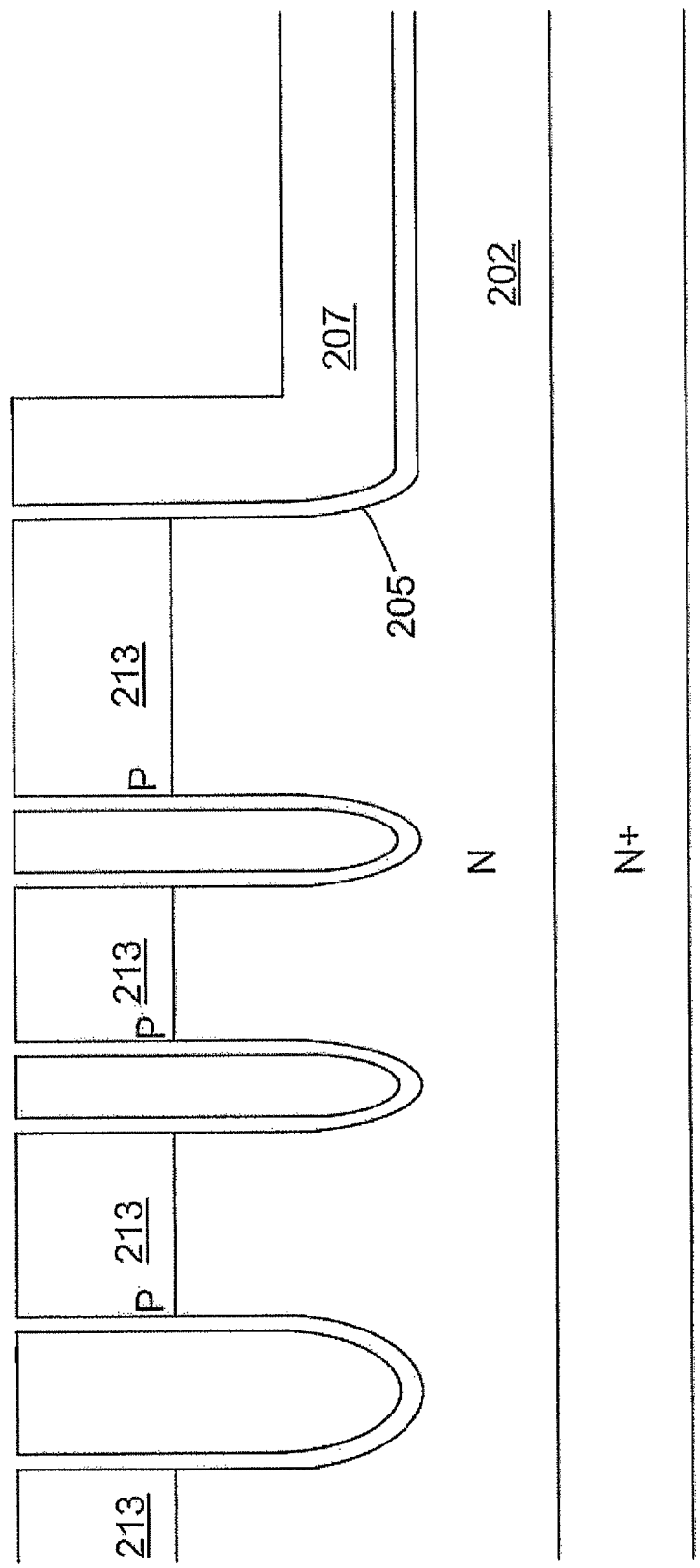

In FIG. 9C, a plurality of P body regions 213 are formed in an upper portion of the N epitaxial layer 202 by a body ion implantation process which is performed without requiring a P-body mask because the trenched field plate 207 on the trench bottom of the wide termination trench 205 prevent the termination area underneath the wide termination trench 205 from being implanted.

Figure 9D:
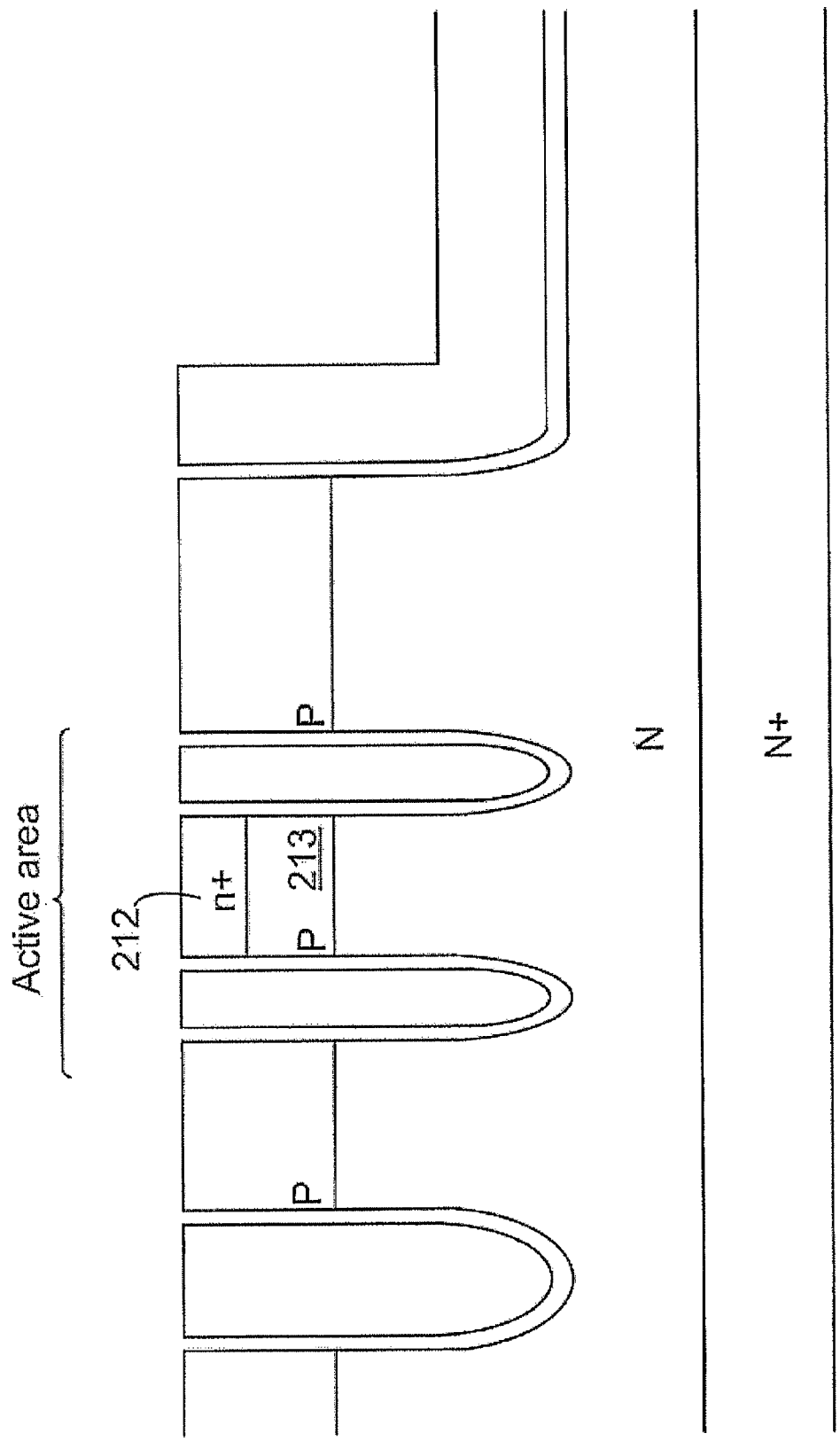

In FIG. 9D, a source mask (not shown) is applied before a source ion implantation process is carried out and then followed by a source diffusion process to form an n+ source region 212 near a top surface of the P body region 213 in an active area of the trench MOSFET.

Figure 9E:
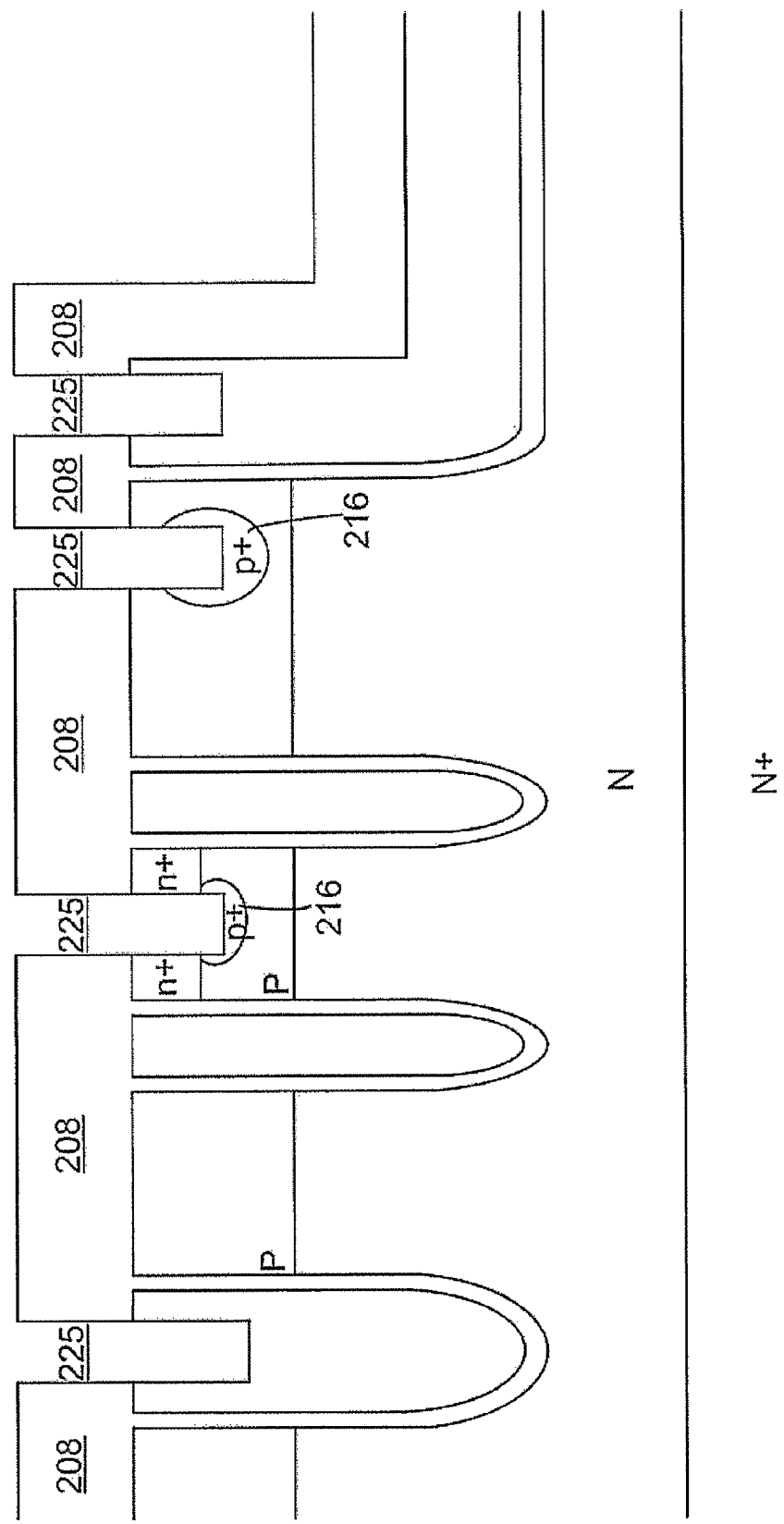

In FIG. 9E, a thick oxide layer is deposited on the entire surface of the structure in FIG. 9D as an inter-insulating layer 208. Then, a contact mask (not shown) is employed and then followed by successively dry oxide etch and dry silicon etch processes to define a plurality of contact holes 225. Next, after carrying out a BF2 ion implantation and a step of RTA (rapid thermal annealing), a p+ body ohmic doped region 216 is formed surrounding bottom of each of the contact holes 225 in the portion of the P body regions 206.

Figure 9F:
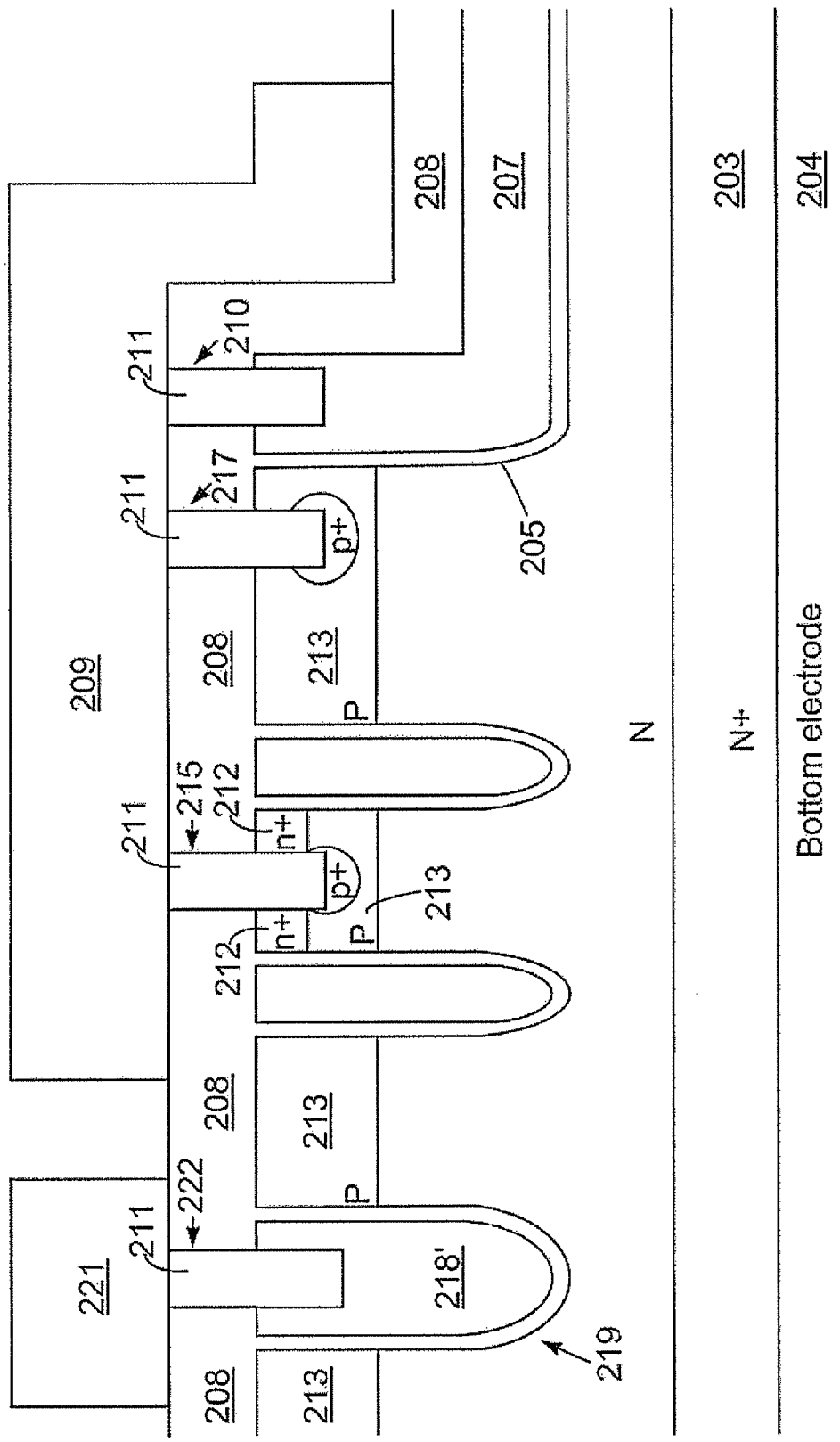

In FIG. 9F, a barrier layer of Ti/TiN or Co/TiN or Ta/TiN and a tungsten metal layer are successively deposited on sidewall and bottom of each of the contact holes and are then etched back to form a contact metal plug 211 respectively for: a trenched field plate contact 210 penetrating through the inter-insulating layer 208 and extending into the trenched field plate 207; a trenched source-body contact 215 penetrating through the inter-insulating layer 208, the source region 212 and extending into the body region 213; a trenched body contact 217 penetrating through the inter-insulating layer 208 and extending into the body region 213 close to the wide termination trench 205; and a trenched gate contact 222 penetrating through the inter-insulating layer 208 and extending into the wide single electrode 218'. Wherein after the deposition of the barrier layer, a step of RTA is selectively performed to form silicide layer. Then, a metal layer of Al alloys or Cu padded by a resistance-reduction layer of Ti or Ti/TiN underneath is deposited onto the inter-insulating layer 208 and followed by a metal etch process by employing a metal mask (not shown) to be patterned to form a gate metal 221 and a source metal 209, wherein the source metal 209 is connected to the trenched field plate 207 as a top electrode. Last, a back metal of Ti/Ni/Ag is deposited onto the bottom side of the N+ substrate 203 as a bottom electrode 204 for drain contact after grinding.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising a trench MOSFET having an active area and a termination area, further comprising:
    an epitaxial layer of said first conductivity type supported onto a substrate of said first conductivity type;
    a plurality of active trenched gates filled in active trenches surrounded by a source region of said first conductivity type encompassed in a body region of a second conductivity type in said active area, wherein each of said active trenched gates has a shielded gate structure comprising a shielded electrode in a lower portion and a gate electrode in an upper portion of each active trenches, wherein sidewalls and bottom of said shielded electrode is surrounded by a first gate insulating layer, sidewalls of said gate electrode is surrounded by a second gate insulating layer, wherein said shielded electrode and said gate electrode is insulated from each other by an inter-insulating layer;
    at least a connection trenched gate filled in a gate connection trench in a gate contact area;
    a wide termination trench formed in said epitaxial layer in said termination area, wherein said body region adjacent to trench sidewalls of said wide termination trench has a junction depth shallower than said wide termination trench; and
    a trenched field plate disposed along inner surface of said wide termination trench and padded with a termination insulating layer, having a L shape or an U shape structure.

2. The semiconductor power device of claim 1 wherein:
    said wide termination trench extends to an edge of said semiconductor power device and said trenched field plate has said L shape structure.

3. The semiconductor power device of claim 1 wherein:
    said wide termination trench extends towards but not to an edge of said semiconductor power device and said trenched field plate has said U shape structure.

4. The semiconductor power device of claim 1 wherein:
    said trenched field plate is a doped poly-silicon layer.

5. The semiconductor power device of claim 1 wherein:
    said first gate insulating layer has a greater thickness than said second gate insulating layer.

6. The semiconductor power device of claim 1 wherein:
    said gate electrode is connected to a gate metal and said shielded electrode is connected to a source metal.

7. The semiconductor power device of claim 1 wherein:
    said trenched field plate is connected to a source metal of said trench MOSFET via a trenched field plate contact filled with a contact metal plug.

8. The semiconductor power device of claim 1 wherein:
    said trenched field plate is connected to a gate metal of said trench MOSFET via a trenched field plate contact filled with a contact metal plug.

9. The semiconductor power device of claim 1 wherein:
    said wide termination trench in said termination area has a trench width greater than said gate contact trench in said gate contact area and said gate contact trench has a trench width greater than said gate trenches in an active area.

10. The semiconductor power device of claim 1 further comprising an on-resistance reduction region of said first conductivity type with doping concentration higher than said epitaxial layer, surrounding said active trenches, said gate connection trench and said wide termination trench.

11. The semiconductor power device of claim 1 wherein said wide termination trench has a trench width greater than 1.0 um.

12. A semiconductor power device comprising a trench Schottky rectifier having an active area and a termination area, further comprising:
    an epitaxial layer of said first conductivity type supported onto a substrate of said first conductivity type;
    a wide termination trench formed in said epitaxial layer in said termination area;
    a trenched field plate disposed along inner surface of said wide termination trench and padded with a termination insulating layer, having a L shape or an U shape structure; wherein
    said semiconductor power device is a trench Schottky rectifier further comprising a Schottky rectifier layer lined in a plurality of trenched anode contacts disposed between two adjacent trenched gates in said active area, wherein each said trenched anode contacts is filled with a contact metal plug.

13. The semiconductor power device of claim 12 wherein:
    said trenched Schottky rectifier further comprises a Schottky barrier height enhancement region of said first conductivity type surrounding sidewalls and bottom of each said trenched anode contact in said epitaxial layer, wherein said Schottky barrier height enhancement region has a doping concentration lower than said epitaxial layer.

14. The semiconductor power device of claim 12 wherein:
    said trenched Schottky rectifier further comprises a Schottky barrier height enhancement region of said second conductivity type surrounding sidewalls and bottom of each said trenched anode contact in said epitaxial layer.

15. The semiconductor power device of claim 12 wherein said wide termination trench has a trench width greater than 1.0 um.

16. The semiconductor power device of claim 12 wherein: said wide termination trench extends to an edge of said semiconductor power device and said trenched field plate has said L shape structure.

17. The semiconductor power device of claim 12 wherein: said wide termination trench extends towards but not to an edge of said semiconductor power device and said trenched field plate has said U shape structure.

18. The semiconductor power device of claim 12 wherein: said trenched field plate is a doped poly-silicon layer.

19. A method for manufacturing a semiconductor power device, comprising:
   forming a wide termination trench in a termination area, a plurality of active trenches and mesas in an active area and at least a gate connection trench in a gate connection area in an epitxail layer;
   forming an insulating layer on top surface of said mesas, inner surface of said wide termination trench, said active trenches and said gate connection trench;
   depositing a doped poly-silicon layer;
   carrying out CMP (Chemical Mechanical Polishing) to remove said doped poly-silicon layer from the top surface of said mesas and leave said doped poly-silicon layer on inner surface of said wide termination trench including trench sidewalls and trench bottom as a trenched field plate having a L shape or U shape structure.

20. The method of claim 19 further comprises a step to form a trenched field plate contact penetrating through a contact interlayer and extending into said trenched field plate.

* * * * *